(12) United States Patent
Saito et al.

(10) Patent No.: US 7,042,055 B2
(45) Date of Patent: May 9, 2006

(54) SEMICONDUCTOR DEVICE AND MANUFACTURING THEREOF

(75) Inventors: Shinichi Saito, Kodaira (JP); Kazuyoshi Torii, Tsukuba (JP); Takahiro Onai, Ome (JP); Toshiyuki Mine, Fussa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/174,948

(22) Filed: Jun. 20, 2002

(65) Prior Publication Data

US 2003/0042535 A1    Mar. 6, 2003

(30) Foreign Application Priority Data

Aug. 29, 2001   (JP)   ............... 2001-259145

(51) Int. Cl.
*H01L 29/76*   (2006.01)
*H01L 29/94*   (2006.01)
*H01L 31/62*   (2006.01)

(52) U.S. Cl. ............ 257/410; 257/411; 257/412; 438/301; 438/585; 438/778; 438/782; 438/785

(58) Field of Classification Search ........ 438/585, 438/301, 782, 778, 785; 257/412, 410, 411
See application file for complete search history.

(56) References Cited

U.S. PATENT DOCUMENTS 5,525,857 A * 6/1996 Gnade et al. ............... 313/309
5,569,058 A * 10/1996 Gnade et al. ............... 445/24
5,650,650 A * 7/1997 Ohmi et al. ............... 257/351
6,060,755 A   5/2000 Ma et al. ............... 257/410
6,303,418 B1* 10/2001 Cha et al. ............... 438/199
2001/0012698 A1* 8/2001 Hayashi et al. ............... 83/876
2001/0026000 A1* 10/2001 Matsuoka ............... 83/876

FOREIGN PATENT DOCUMENTS

| JP | 5-343391 | 12/1993 |
| JP | 9-148543 | 6/1997 |
| JP | 10-223888 | 8/1998 |
| JP | 11-176828 | 7/1999 |
| JP | 2000-235975 | 8/2000 |
| JP | 2001-284581 | * 10/2001 |

OTHER PUBLICATIONS

David j. Dumin et al., "A Model Relating Wearout to Breakdown In Thin Oxides", IEEE Transactions on Electron Devices, vol. 41, No. 9, Sep. 1994, pp. 1570-1580.*

(Continued)

*Primary Examiner*—Long Pham
*Assistant Examiner*—Shrinivas H. Rao
(74) *Attorney, Agent, or Firm*—Miles & Stockbridge PC

(57) ABSTRACT

In a miniaturized field effect transistor, the roughness of the interface between a gate dielectric film and a gate electrode is controlled on an atomic scale. The thickness variation of the gate dielectric film is lowered, whereby a field effect transistor with high mobility is manufactured. An increase in the mobility in the field effect transistor can be achieved not only in the case of using a conventional $SiO_2$ thermal oxide film as the gate dielectric film but also in the case of using a high dielectric material for the gate dielectric film.

30 Claims, 18 Drawing Sheets

OTHER PUBLICATIONS

D. Buchanan, "Scaling the Gate Dielectric: Materials, Integration and Reliability", IBM J. Res. Develop., vol. 43, No. 3, May 1999, pp. 245-264.

J. Li et al, "Scattering of Silicon Inversion Layer Electrons by Metal/Oxide Interface Roughness", J. Appl. Phys., vol. 62, No. 10, Nov. 15, 1987, pp. 4212-4215.

T. Yamanaka, "Correlation Between Inversion Layer Mobility and Surface Roughness Measured by AFM", IEEE Electron Device Letters, vol. 17, No. 4, Apr. 1996, pp. 178-180.

* cited by examiner

SEMICONDUCTOR DEVICE AND MANUFACTURING THEREOF

BACKGROUND OF THE INVENTION

The present invention relates to a metal-insulator-semiconductor-field-effect transistor (MISFET) and a semiconductor device comprising a metal-insulator-semiconductor-field-effect transistor.

The integrated circuit technology using silicon has been developed at an amazing speed. As a miniaturization technology progresses, the size of the devices has been reduced, it has become possible to integrate an increasing number of devices in a single chip, and, as a result, an increasing number of functions have been realized. At the same time, a higher operation speed has been achieved by enhancement of drive current capability and a reduction in parasitic capacitance with the miniaturization of the devices.

The enhancement of the drive current capability of the field effect transistor is due mainly to thinning of the gate dielectric film. Even if the gate dielectric film is made thinner, the power source voltage is not lowered proportionately. Therefore, a very high electric field has come to be impressed on an inversion layer. Further, the increase in the impurity concentration in a channel so as to restrain a short channel effect attendant on the miniaturization of devices also spurs the rise in electric field. When a high electric field is applied to the inversion layer, carriers are scattered due to the roughness of the interface between the silicon substrate and the gate dielectric film (hereinafter, referred to simply as "the substrate surface roughness"), so that there is the problem that mobility is lowered. The same degree of roughness is present not only at the interface between the silicon substrate and the gate dielectric film but also at the interface between the gate dielectric film and a gate electrode. The variation in the thickness of the gate dielectric film will be referred to simply as "the gate roughness".

In view of the above, many researches on reduction in the substrate surface roughness have been made. For example, Japanese Patent Laid-open Nos. 5-343391 (1993), 9-158543 (1997), and 2000-235975 describe methods of forming an oxide film by use of radical oxygen. Japanese Patent Laid-open No. 10-223888 (1998) describes a method of alleviating the substrate surface roughness by use of a film stack of a pyro-oxide film and a dry-oxide film, and Japanese Patent Laid-open No. 11-176828 (1999) describes a method of removing a spontaneous oxide film, thereafter providing a low temperature oxide film as a protective film, and then performing an oxidation process.

SUMMARY OF THE INVENTION

It is an object of the present invention to provide a field effect transistor with high mobility using an ultrathin gate dielectric film.

It is another object of the present invention to provide a gate dielectric film/gate electrode laminate structure with little degradation in carrier mobility in a field effect transistor using an ultrathin gate dielectric film.

Main aspects of the present invention will be described below.

In accordance with a first aspect of the present invention, there is provided a metal-insulator-semiconductor field effect transistor (MISFET) comprising a gate dielectric film having an equivalent oxide thickness (EOT) of silicon dioxide ($t_{EOT}$) of 2 nm or less, given by the expression $t_{EOT} = t_{ox} \cdot \in_{SiO2} / \in_{ox}$ where $\in_{SiO2}$ is a relative dielectric constant of silicon dioxide, $\in_{ox}$ is a relative dielectric constant of the gate dielectric film, and $t_{ox}$ is an average of the physical thickness of the gate dielectric film, wherein a ratio ($\Delta/t_{ox}$) of the difference ($\Delta$) between the maximum and the minimum of the physical thickness of the gate dielectric film present on the upper side of a channel portion of a single field effect transistor to the average ($t_{ox}$) of the physical thickness is 10% or less.

The present invention is extremely useful for a metal-insulator-semiconductor field effect transistor (MISFET) comprising a gate dielectric film having an equivalent oxide thickness (EOT) of silicon dioxide ($t_{EOT}$) of not more than 2 nm, in the case of a dielectric film, more specifically, a silicon dioxide gate dielectric film or other dielectric film. This applies also to the following other aspects of the present invention.

In accordance with a second aspect of the present invention, there is provided a metal-insulator-semiconductor field effect transistor (MISFET) comprising a gate dielectric film having an equivalent oxide thickness (EOT) of silicon dioxide ($t_{EOT}$) of 2 nm or less, given by the expression $t_{EOT} = t_{ox} \cdot \in_{SiO2} / \in_{ox}$, where $\in_{SiO2}$ is a relative dielectric constant of silicon dioxide, $\in_{ox}$ is a relative dielectric constant of the gate dielectric film, and $t_{ox}$ is an average of physical thickness of the gate dielectric film, wherein dispersion ($\Delta_{RSR}$) of the physical thickness of the gate dielectric film present on the upper side of a channel portion of a single field effect transistor is $0.15 \cdot \in_{ox} / \in_{SiO2}$ nm or less. Here, RSR is the abbreviation of Remote Surface Roughness.

In accordance with a third aspect of the present invention, there is provided a metal-insulator-semiconductor field effect transistor (MISFET) wherein the value of the correlation length $\Lambda_{RSR}$ of the gate roughness obtained by fitting the correlation function of the physical thickness of the gate dielectric film present at a channel portion of a field effect transistor with Gaussian distribution by the least squares method is $\Lambda_{RSR} < 1.0$ nm or $\Lambda_{RSR} > 2.5$ nm.

In accordance with a fourth aspect of the present invention, there is provided a metal-insulator-semiconductor field effect transistor (MISFET) comprising a high dielectric gate dielectric film formed of a high dielectric (high-k) material having a relative dielectric constant ($\in_{ox}$) greater than a relative dielectric constant ($\in_{SiO2}$) of silicon dioxide, wherein the high dielectric gate dielectric film maintains an amorphous state, or crystal grains are scatteredly present in the inside of the high dielectric gate dielectric film.

In accordance with a fifth aspect of the present invention, there is provided a metal-insulator-semiconductor field effect transistor (MISFET) which does not comprise a floating gate electrode, wherein an amorphous Si film having an average physical thickness of not more than 8 nm is provided directly above a gate dielectric film.

A semiconductor device according to the present invention is a semiconductor device comprising at least one metal-insulator-semiconductor field effect transistor (MISFET) according to any of the above aspects of the present invention.

A typical example of a method of manufacturing a semiconductor device according to the present invention is a method of manufacturing a metal-insulator-semiconductor field effect transistor (MISFET) which comprises sequentially the steps of: providing a first gate electrode at a portion of a main surface region of a semiconductor substrate of a first conduction type with a first dielectric film therebetween; performing an activation annealing process by injecting a high impurity concentration region of a second conduction type into the semiconductor substrate; covering the entire surface with a second dielectric film and then planarizing the surface of the second dielectric film to expose the surface of the first gate electrode; removing the first gate electrode and the first dielectric film; providing a silicon oxide or silicon oxynitride film as a gate dielectric film; and forming poly-crystalline Si as a gate electrode.

In addition, a method of manufacturing a metal-insulator-semiconductor field effect transistor (MISFET) wherein the highest thermal treatment temperature after the formation of the gate dielectric film is lower than a crystallization temperature of the gate dielectric film material is extremely useful.

According to the present invention, there can be provided a field effect transistor (FET) with high mobility using an ultrathin gate dielectric film. Further, according to the present invention, there can be provided a gate dielectric film/gate electrode laminate structure with little degradation of carrier mobility in a field effect transistor (FET) using an ultrathin gate dielectric film.

These aspects will be described in detail below referring to embodiments.

DETAILED DESCRIPTION OF THE PREFERRED EMBODIMENTS

Prior to exemplifying concrete embodiments of the present invention, technologies related to the present invention and a comparison of the present invention and the background art will be described in detail.

Technologies mainly related to the attainment of the objects of the present invention include the following three technologies.

First, the objects are attained by setting a gate interface parallel to a substrate surface and causing substrate surface roughness and gate roughness to be modulated with the same phase, same amplitude and same wave length.

According to the investigations by the present inventors, the scattering of carriers due to the gate roughness is due to the fact that surface potential, the center position of an inversion layer, electric charge, and polarization are locally modulated and the electrons in the inversion layer which sense the modulations are strongly scattered. Among others, the modulation of the surface potential is the most principal factor of the scattering. Where the substrate surface roughness and the gate roughness are wavy, if the substrate surface roughness and the gate roughness are modulated basically with substantially the same phase, same amplitude and same wave length, the oxide film thickness becomes constant independently of space, and therefore, the scattering due to the surface potential and the degradation in mobility are obviated.

Another method of attaining the objects of the present invention is to reduce the amplitude of the gate roughness.

Here, the amplitude ($\Delta_{RSR}$) of the gate roughness means the dispersion of the position (r) dependence of the physical thickness ($t_{phys}(r)$) of the gate dielectric film present at a channel portion of the field effect transistor (FET). The physical thickness of the gate dielectric film is measured, for example, by use of a transmission electron microscope (TEM).

That is to say, by use of the average physical thickness $$t_{ox} = <t_{phys}(r)>$$ Expression 1, the amplitude ($\Delta_{RSR}$) of the gate roughness is defined as $$\Delta_{RSR} = \sqrt{<(t_{phys}(r) - t_{ox})^2>}$$ Expression 2, where the symbol < > represents an averaging operation.

Here, the amplitude $\Delta_{RSR}$ of the gate roughness, namely, the dispersion in the thickness of the gate dielectric film is different from the thickness variation among a plurality of field effect transistors present in the same wafer, but is the local variation in a single field effect transistor. Therefore, the thickness variation exists on an atomic scale, even in the case where the uniformity in the same wafer is high and the thickness variation among the plurality of field effect transistors is small. Accordingly, this is an unavoidable problem in the high dielectric field effect transistor in which the gate oxide film thickness is small.

Figure 3:
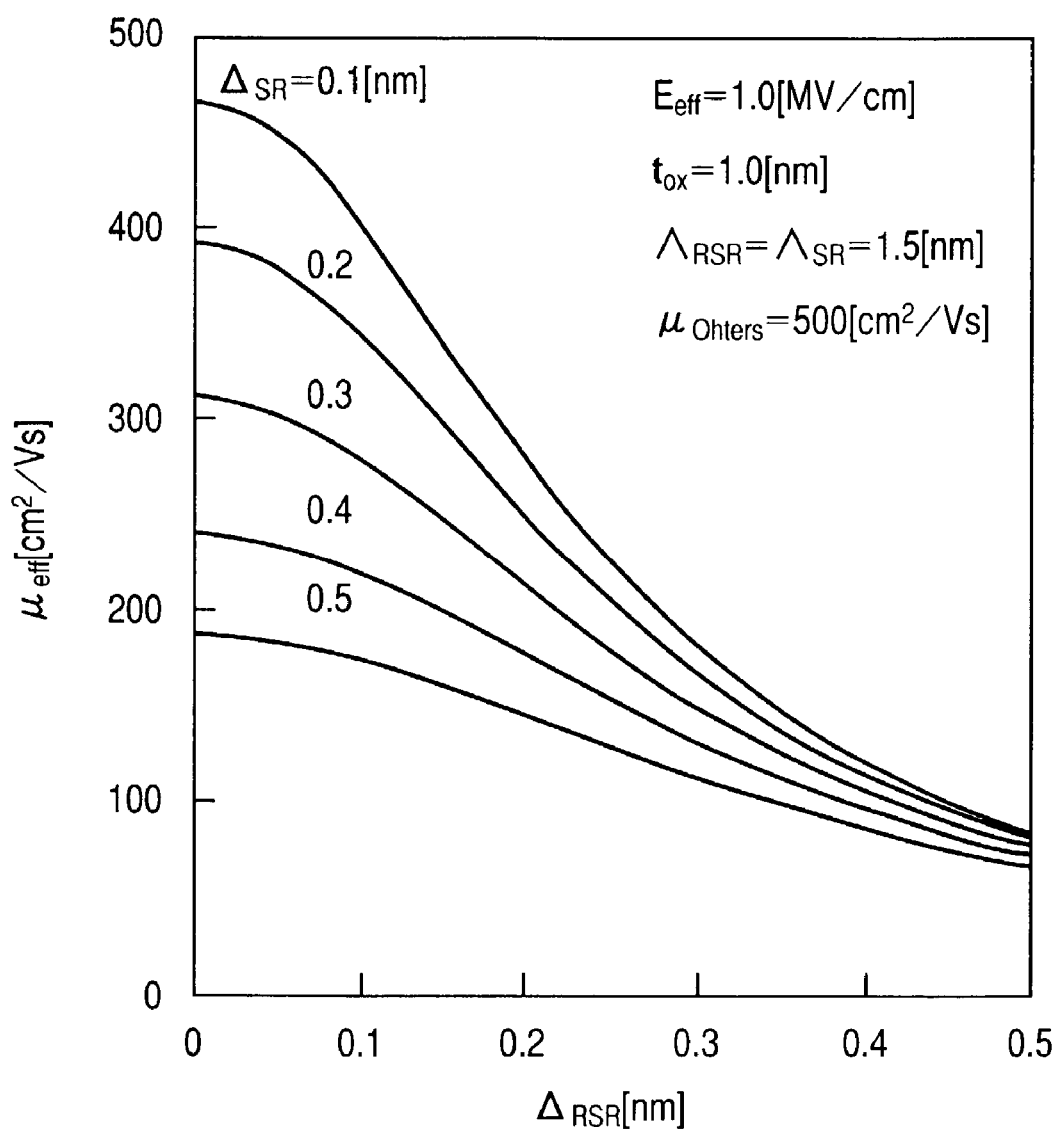
FIG. 3 is a diagram showing an example of the dependence of mobility on amplitude of dielectric film thickness variation.

FIG. 3 shows an example of the dependency of mobility on the gate roughness amplitude $\Delta_{RSR}$. As naturally expected, the degradation (reduction) of the mobility due to RSR is smaller as the gate roughness amplitude is smaller, namely, as the gate interface is smoother. It is known that, by use of a precisely controlled film formation process, the gate roughness immediately after the film formation can be suppressed to 0.1 nm or below. For example, Japanese Patent Laid-open No. 2000-235975 describes that, by forming an oxide film by use of radical oxygen, the roughness of the gate dielectric film (namely, the gate oxide film in this case) can be reduced to 0.7 nm or below. Nevertheless, after formation of the gate electrode, a roughness as large as 0.3 to 0.8 nm exists at the gate electrode/gate dielectric film interface. For example, IBM. J. Res. Develop. Vol. 43, No. 3, p. 245, 1999 and the like describe the experimental results of the observation of a field effect transistor (FET) by use of a transmission electron microscope (TEM).

Figure 4:
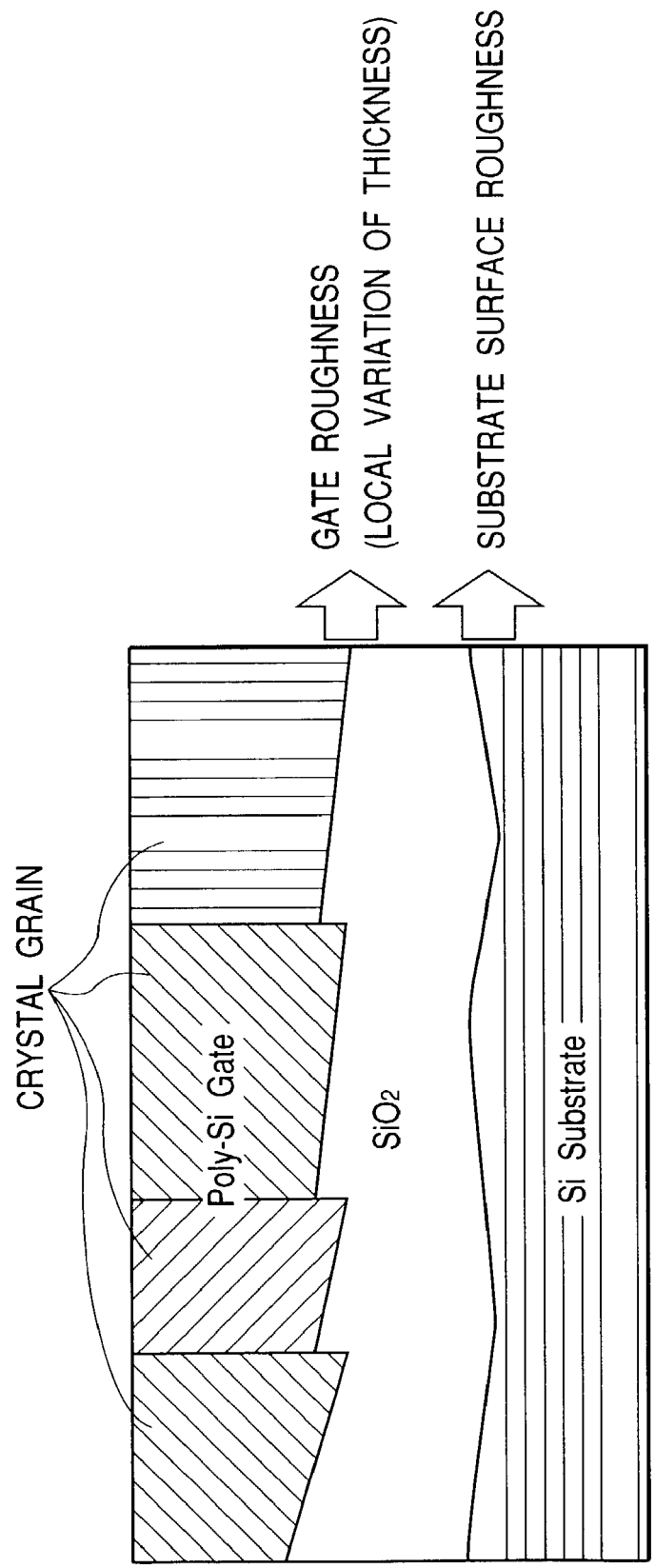
FIG. 4 is a sectional view of a metal-insulator-semiconductor field effect transistor (MISFET)

The major cause of such a roughness resides probably in that the gate roughness is modulated with a period equal to the crystal grain radius in the gate electrode, as schematically shown in FIG. 4. Therefore, it is possible to suppress the gate roughness by making the gate electrode material amorphous or polycrystalline with a very small grain radius.

A third method of attaining the objects of the present invention comprises using a poly-crystalline material for the gate electrode and making the grain radius on the same order as the gate length. According to the examination by the present inventors, the mobility depends not only on the amplitude of the gate roughness but also on the correlation length of the gate roughness. Here, the correlation length of the gate roughness is defined as the value of $\Lambda_{RSR}$ obtained by fitting the correlation function of the position r and the position r':

$$<(t_{phys}(r)-t_{ox})(t_{phys}(r')-t_{ox})>$$ Expression 3 by the Gaussian distribution:

$$\Lambda_{RSR}^2 e-(r-r')(r-R7)/\Lambda_{RSR}^2$$ Expression 4 based on the measured values of the dependency of the thickness $t_{phys}(r)$ of the gate dielectric film at the position r.

Figure 5:
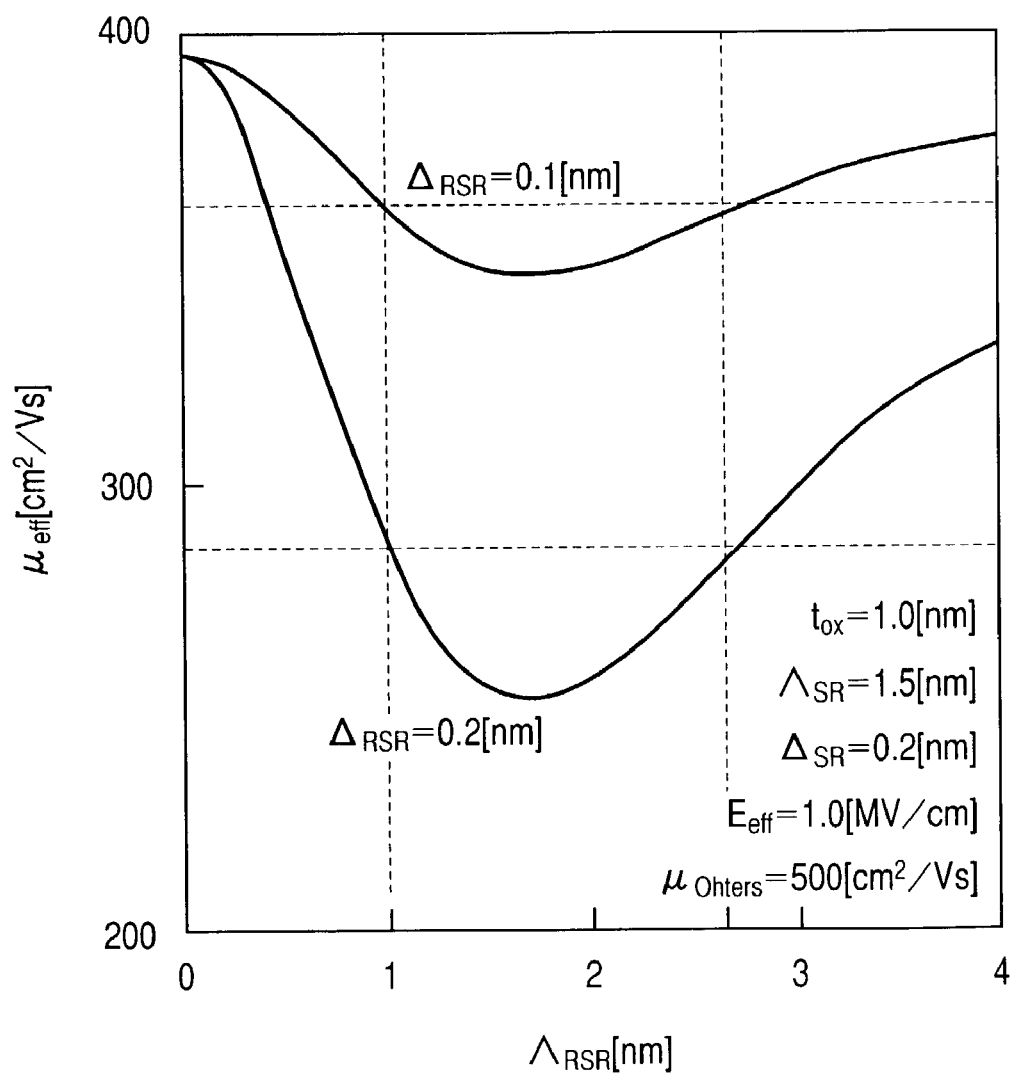
FIG. 5 is a diagram showing the dependence of mobility on correlation length of dielectric film thickness variation.

FIG. 5 is a diagram showing an example of the relation between the correlation length ($\Lambda_{RSR}$) and the mobility ($\mu_{eff}$). As shown in FIG. 5, the mobility takes a minimum when the correlation length is several nanometers. In particular, especially favorable results are obtained when the correlation length $\Lambda_{RSR}$ is, in the range of $\Lambda_{RSR}<1.0$ nm or $\Lambda_{RSR}>2.5$ nm. This is because scattering most easily occurs when the reciprocal of the wave number of characteristic electrons determined by temperature, electric field or the like is substantially equal to the correlation length of the gate roughness.

Since the gate roughness has a major component determined by the grain radius of the gate electrode as described above, the correlation length is enlarged by making the grain radius of the gate electrode material larger. Therefore, it is possible to suppress the degradation of the mobility.

A fourth method of attaining the objects of the present invention is to use a material having a high relative dielectric constant for the gate dielectric film. When a material having a high relative dielectric constant is used, a many inversion carriers can be induced even where the physical thickness is large. Inasmuch as the gate roughness is farther from the channel, the effect thereof is smaller as compared with the case of using silicon dioxide.

The present invention will be described in detail below referring to Examples. For easy understanding, the description will be made using drawings, in which major portions are shown in an enlarged state as compared with other portions. The material, conduction type, manufacturing conditions and the like of each portion are not limited to the description of the Examples, and, naturally, various modifications are possible.

<Comparison with Known Technologies>

Roughness is not only present at an interface between a silicon substrate and a gate dielectric film, but also a roughness of the same degree or greater is present at an interface between a gate dielectric film and a gate electrode. Therefore, there arises the problem that mobility is degraded due to the gate roughness. For example, J. Appl. Phys. Vol. 62, No. 10, p. 4212 (1987) shows the results of theoretical calculations indicating that thickness variations due to the gate roughness induce a variation in potential, thereby degrading the mobility. In addition, Japanese Patent Laid-open No. 10-223888 (1998) describes a theoretical presumption that thickness variations vary largely the electrostatic potential.

Conventionally, however, the thickness of the gate dielectric film has been great, and the effect thereof has produced little problem. For example, IEEE Electron Device Letters, Vol. 17, p. 178, 1996 and the like describe experimental results that the mobility is independent of gate oxide thickness where the oxide thickness is in the range of down to about 3 nm. In fact, according to the detailed examinations by the present inventors using quantum statistical mechanics, it has been confirmed that the degradation of mobility due to gate roughness is not serious where the thickness of the silicon dioxide gate dielectric film is in the range down to about 3 nm.

Figure 2:
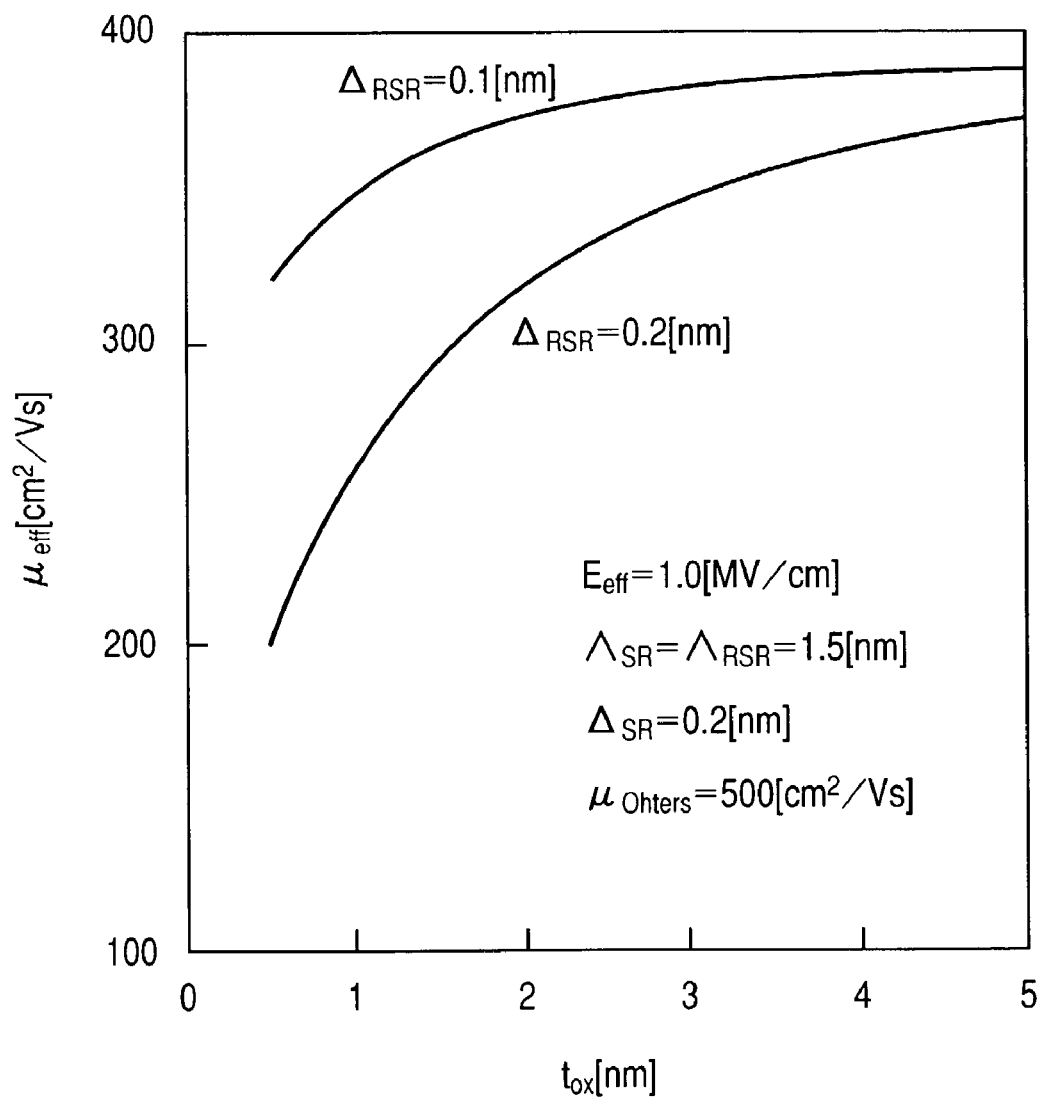
FIG. 2 is a diagram showing an example of the dependence of mobility on dielectric film thickness.

According to the investigations by the present inventors, however, it has been found out that, when the gate oxide film becomes thinner attendantly on the miniaturization of devices and a high electric field is applied to a channel portion, the mobility is steeply lowered due to the gate roughness. FIG. 2 shows the dependency of mobility on gate oxide film thickness in an n-type field effect transistor at an applied electric field of 1 MV/cm. The mobility is steeply lowered at a gate oxide film thickness of not more than 2 nm. The thinnest of the silicon dioxide gate dielectric film used at present is about 2 nm. Therefore, these gate dielectric films are already in the region where the degradation of mobility due to gate roughness becomes conspicuous.

From the above facts, it can be understood that the present invention is extremely useful for metal-insulator-semiconductor field effect transistors (MISFET) comprising a gate dielectric film having an equivalent oxide thickness of silicon dioxide ($t_{EOT}$) of not more than 2 nm.

EXAMPLE 1

In Example 1, it is verified that (1) the equivalent oxide thickness of silicon dioxide $t_{EOT}$ is made to be not more than 2 nm, and (2) the ratio ($\Delta/t_{ox}$) of the difference $\Delta$ between the maximum and the minimum of the physical thickness of the gate dielectric film present on the upper side of a channel portion of a field effect transistor to the average $t_{ox}$ of the physical thickness is made to be not more than 10%.

Further, it is verified that the dispersion ($\Delta_{RSR}$) of the physical thickness of the gate dielectric film present on the upper side of the channel portion of the field effect transistor is not more than $0.15\epsilon_{ox}/\epsilon_{SiO2}$ nm.

In order to suppress the degradation of mobility due to the gate roughness, it is preferable that the gate electrode is made poly-crystalline. Because of this, the variations of local thickness of the gate dielectric film must be prevented from increasing. For this purpose, it is effective that the gate electrode directly above the gate dielectric film is not made poly-crystalline but is maintained in the state of amorphous silicon (hereinafter referred to simply as amorphous Si).

According to the examinations by the present inventors, the crystallization temperature of an ultrathin amorphous Si film with a thickness of not more than 8 nm formed at a temperature of not more than about 480° C. by low pressure chemical vapor deposition using disilane ($Si_2H_6$) increases from about 600° C. in the normal condition to about 800° C. where a thin $SiO_2$ film is present at the surface. Therefore, by providing a thin amorphous Si film intermediately between the poly-crystalline Si gate electrode and the gate dielectric film, it is possible to suppress gate roughness. In the present example, this technology is applied to the case where the gate dielectric film and the gate electrode are stacked.

Now, a description will be made below of Example 1 in which a small gate roughness and, hence, a high mobility are achieved by maintaining the gate electrode directly above the gate dielectric film to be amorphous, in a metal-insulator-semiconductor field effect transistor (MISFET) not having a floating gate electrode.

Figure 1:
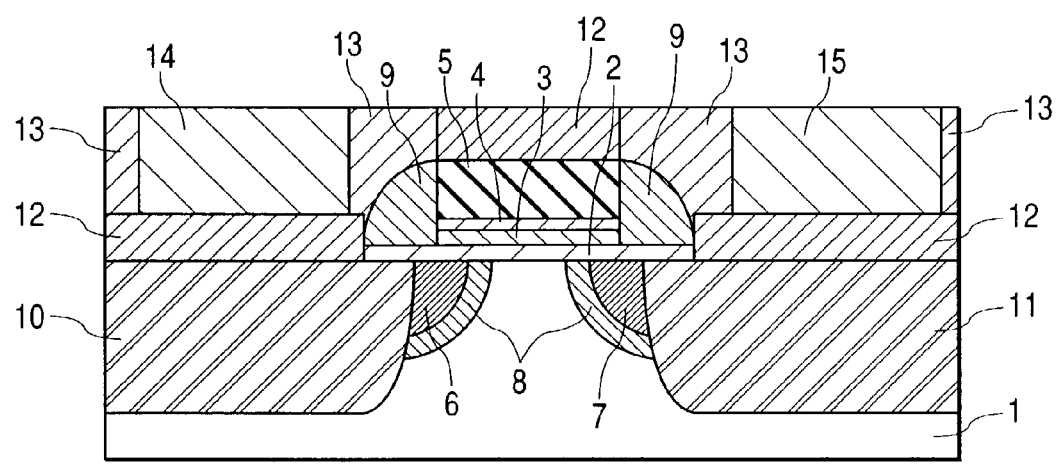
FIG. 1 is a sectional view of a metal-insulator-semiconductor field effect transistor (MISFET) according to a First Example of the present invention.
Figure 6:
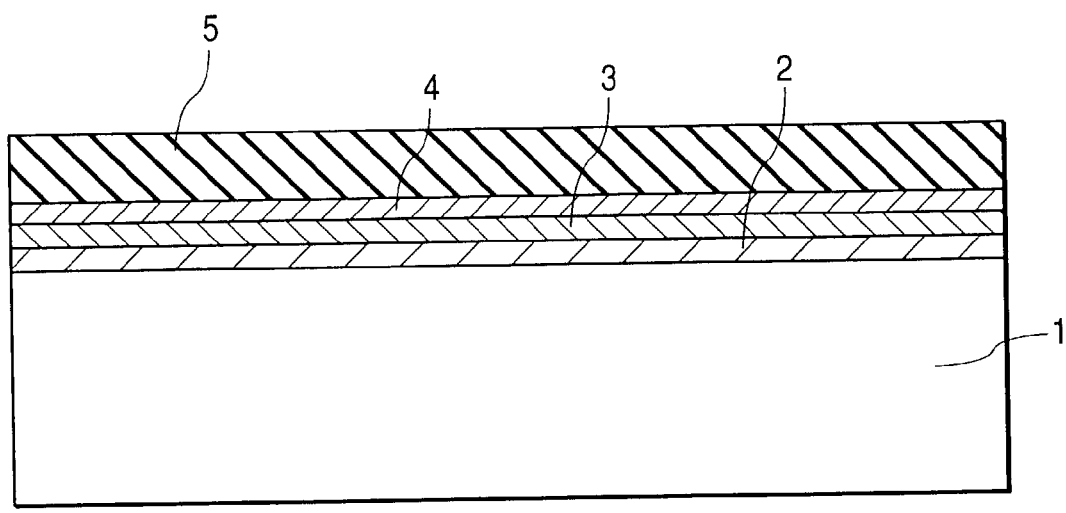
FIG. 6 is a sectional view of a device in the sequence of manufacturing steps of a metal-insulator-semiconductor field effect transistor (MISFET) according to First Example.
Figure 7:
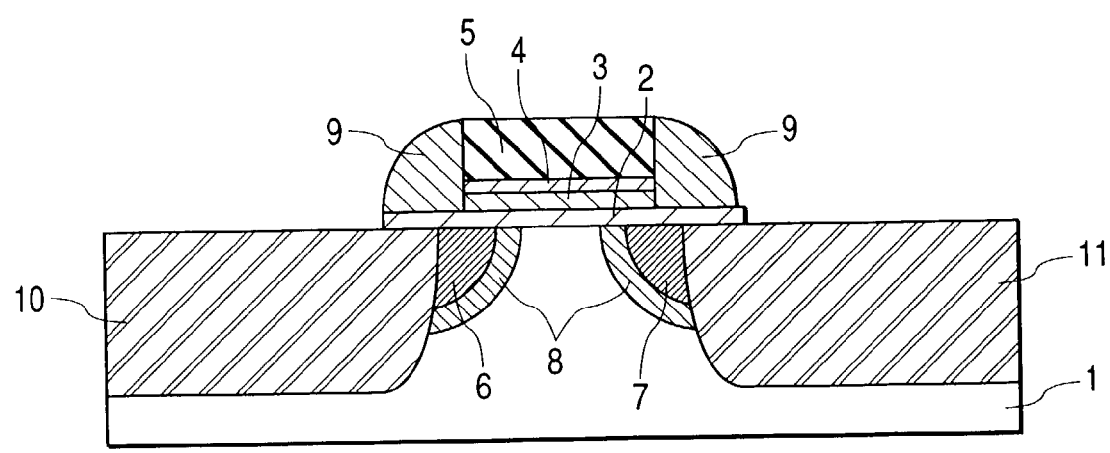
FIG. 7 is a sectional view of the device in the sequence of manufacturing steps of the MISFET according to First Example.

FIG. 1 is a sectional view of a semiconductor device completed according to Example 1 of the present invention, and FIGS. 6 and 7 are sectional views of the device in the sequence of manufacturing steps thereof.

Referring to FIG. 6, formation of a device isolation dielectric region (not shown) for defining an active region in a semiconductor substrate 1 composed of single-crystalline Si, injection of p-conduction type ions for control of substrate concentration and extending thermal treatment, injection of threshold voltage control ions, and an activation annealing process were carried out by the conventional techniques. Thereafter, five kinds of thermal oxide films 2 were formed with a thickness as a parameter of 1.5 nm, 2 nm, 3 nm, 4 nm, and 5 nm, respectively. The semiconductor substrate has a plane orientation of (100), a p conduction type, and a diameter of 20 cm.

Next, an in situ phosphorus-doped ultrathin Si film 3 was built up in a thickness of 2 nm by low pressure chemical vapor deposition using disilane ($Si_2H_6$), and then an ultrathin $SiO_2$ film 4 was built up in a thickness of 0.3 nm continuously in the same apparatus. Further, an in situ phosphorus-doped poly-crystalline Si film 5 becoming a gate electrode 5 was formed. A sectional view of this condition is FIG. 6. The term "in situ phosphorus-doped" is used to mean that doping with phosphorus is preliminarily performed before implantation.

In the present example, the in situ phosphorus-doped poly-crystalline Si film 5 was formed at a build-up temperature of 630° C. using monosilane ($SiH_4$) and phosphine ($PH_3$). The lowering of the resistance of the in situ phosphorus-doped poly-crystalline Si film 5 need not be performed by the method of preliminarily adding an impurity as described above. For example, the poly-crystalline Si film may be formed by performing high-concentration ion injection selectively in a desired gate electrode region, according to the conventional method of manufacturing a complementary MOS.

Subsequently, thermal treatment was carried out at 750° C. in a nitrogen ambient for 30 minutes, and then the in situ phosphorus-doped poly-crystalline Si film 5 and the amorphous ultrathin Si film 3 were processed into the form of a gate electrode (5, 3). Here, the ultrathin $SiO_2$ film 4 is as thin as 0.3 nm in thickness, and the thickness is further reduced by crystal grain growth of the in situ phosphorus-doped poly-crystalline Si film 5. Therefore, the ultrathin $SiO_2$ film 4 does not electrically function as a dielectric film, so that electrical problems such as lowering of gate capacitance and an increase in resistance would not be generated.

In the present example, a gate electrode portion is composed of the stack of the in situ phosphorus-doped poly-crystalline Si film 5, the ultrathin $SiO_2$ film 4, and the thin amorphous Si film 3. In addition, as described above, the thin amorphous Si film 3 is disposed between the gate dielectric film 2 and the gate electrode poly-crystalline layer 5, whereby the gate electrode itself is prevented from becoming poly-crystalline.

The following steps will be described referring to FIG. 7. After the formation of the gate electrode portion (3, 4, 5) into a desired shape, arsenic (As) ions were injected in a vertical direction under the conditions of an acceleration energy of 3 keV and a dose of $1\times10^{15}/cm^2$ to form a shallow source diffusion layer 6 and a shallow drain diffusion layer 7. Subsequently, boron (B) ions were injected in a vertical direction at an acceleration energy of 10 keV and a dose of $4\times10^{13}/cm^2$, so as to wrap the shallow source diffusion layer 6 and the shallow drain diffusion layer 7. This p-conduction type region is for functioning as a punch through stopper, and is referred to as a p-conduction type punch through preventive diffusion layer 8. Next, a silicon oxide film of 50 nm in thickness is built up on the entire surface by plasma assisted build-up process at a low temperature of 400° C. Then, by anisotropic dry etching, the silicon oxide film was selectively left only at side wall portions of the gate electrode portion (3, 4, 5) to form gate side wall dielectric films 9. With the gate side wall dielectric films 9 as ion injection inhibitive mask regions, As ions were injected at an acceleration energy of 30 keV and a dose of $2\times10^{15}/cm^2$ to form an n-type high concentration drain diffusion layer 11 and an n-type high concentration source diffusion layer 10 (FIG. 7).

The following steps will be described referring to FIG. 1. Subsequently, activation thermal treatment for injected ions was carried out by nitrogen annealing at 750° C. for 300 minutes. Then, a cobalt (Co) film was built up in a thin form on the entire surface by sputtering, and silicidization was carried out by short period annealing at 500° C. The unreacted Co film was removed by a mixture of hydrochloric acid and oxygenated water, selectively leaving the Co silicide film 12 in the Si substrate exposed area. Thereafter, the resistance of the Co silicide film 12 was lowered by short period thermal treatment.

Next, a thick silicon oxide built-up film was formed on the entire surface, and the surface thereof was planarized by chemical mechanical polishing (CMP) to form a surface passivation dielectric film 13. The surface passivation dielectric film was provided with an opening in a desired region, and a titanium nitride (TiN) film as a diffusion barrier metal for an interconnection metal and a tungsten (W) film as an interconnection metal were built up. Then, this stack was subjected to planarization polishing to selectively leave the W film only in the opening area. Thereafter, a metallic film consisting mainly of aluminum was built up and patterned according to a desired circuit constitution to form interconnections inclusive of a drain electrode 15 and a source electrode 14, thereby completing a field effect transistor. A sectional view of this condition is FIG. 1.

As to the field effect transistor thus manufactured, the following observations were carried out. Firstly, a section of the field effect transistor was observed under a transmission electron microscope (TEM). Secondly, after removal of the gate electrode 3, 5 and the ultrathin SiO2 film 4, the gate dielectric film interface was observed in detail under an atomic force microscope (AFM). As a result of the observations, the following facts were revealed.

Firstly, the ultrathin Si film 3 was found to maintain an amorphous state. Therefore, it was ascertained that an increase in gate roughness due to crystal grain growth had been restrained. Secondly, the ultrathin $SiO_2$ film 4 was almost invisible. Therefore, it was also found that the gate electrode 3 and the gate electrode 5 were in electrical connection, and the ultrathin $SiO_2$ film 4 was not functioning as a dielectric film to lower the gate capacitance. In many cases, the ultrathin $SiO_2$ film 4 is in the range of about 0.1 to 0.5 nm in thickness, and the amorphous Si layer is in the range of about 2 to 8 nm in thickness. More specific thicknesses are set in consideration of thermal treatment conditions during manufacturing steps.

Figure 8:
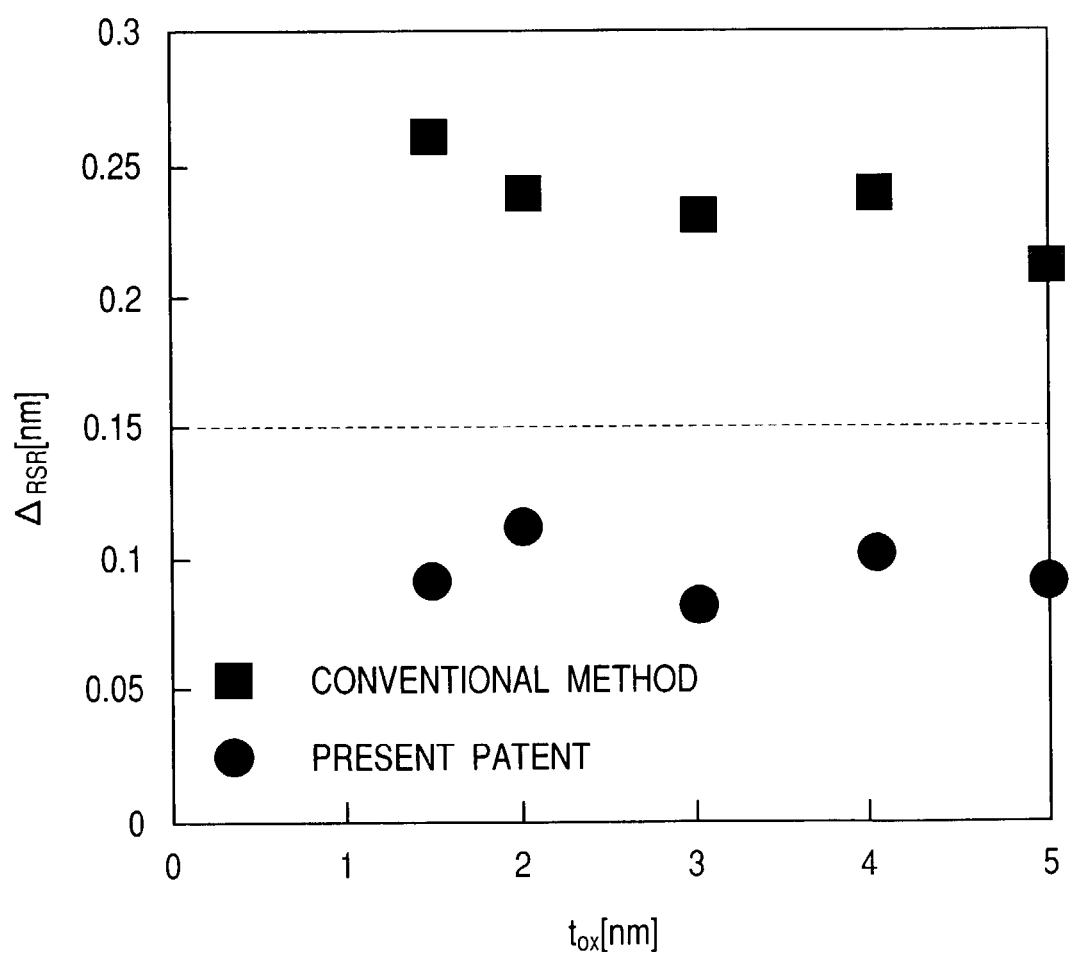
FIG. 8 is a diagram showing the dependence of mobility on dielectric film thickness in First Example.

As a result, it was ascertained that the local variation of thickness of the oxide film which is the gate dielectric film had been suppressed to be low. FIG. 8 is a diagram showing the relationship between the thickness ($t_{ox}$) of the oxide film and the amplitude of roughness of thickness of the field effect transistor (dispersion of thickness) $\Delta_{RSR}$. The symbols ● represent the characteristic according to the present patent, while the symbols ■ represent the results according to the conventional method. As seen in the diagram, in the present example, $\Delta_{RSR}$ was about 0.09 nm on average. In addition, the correlation length (spread of roughness in the direction parallel to the interface) $\Lambda_{RSR}$ was about 1.4 nm. On the other hand, the amplitude $\Delta_{RSR}$ of roughness of thickness of the field effect transistor manufactured by the conventional method was about 0.23 nm on average, and the correlation length $\Lambda_{RSR}$ was about 2.2 nm. Thus, it was confirmed that, in the present example, the local variation of the oxide film thickness was suppressed to be lower than that by the prior art.

Figure 9:
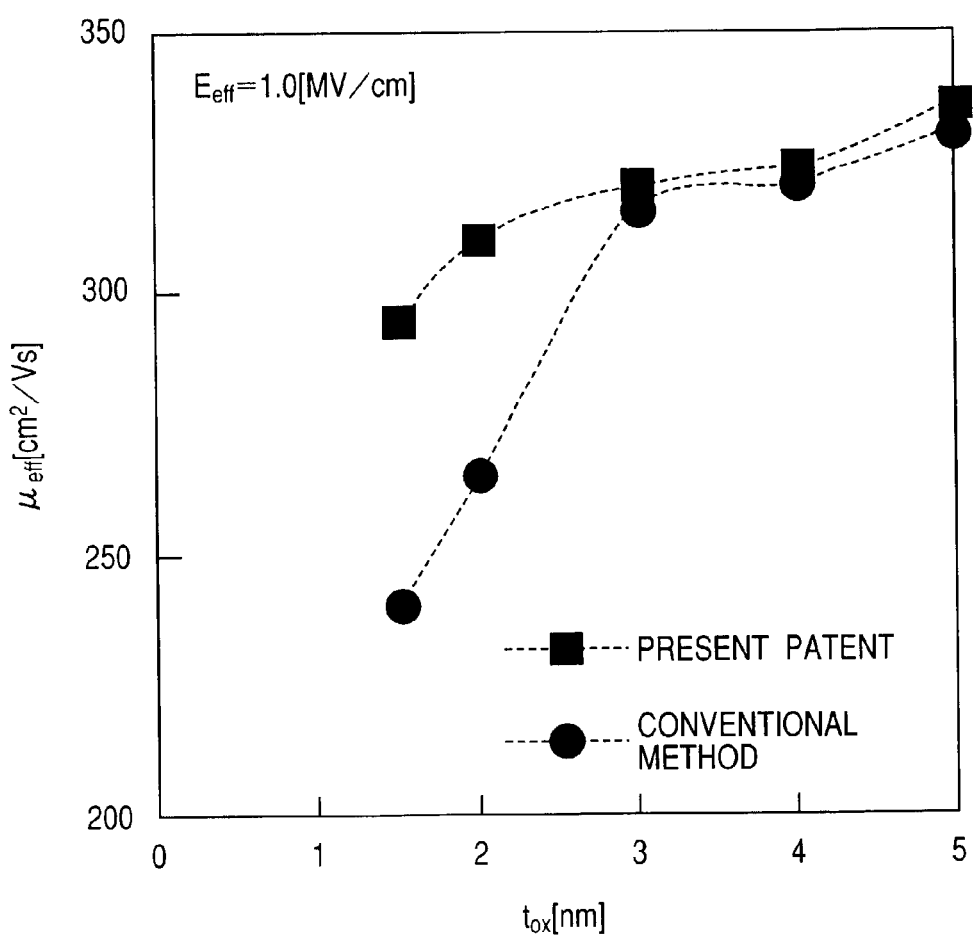
FIG. 9 is a diagram showing the relationship between the average of physical thickness of a gate dielectric film and mobility in First Example.

Further, it was observed that the field effect transistor according to Example 1 shows an increase in mobility by a maximum of about 20%, as compared with the field effect transistor manufactured by the conventional method. FIG. 9 shows an example of the relationship between the thickness ($t_{ox}$) of the oxide film and the mobility ($\mu_{eff}$). In FIG. 9, comparison is made between the results based on the conventional method and the results based on the present patent.

The present invention pertains, particularly, to a metal-insulator-semiconductor field effect transistor (MISFET) having an equivalent oxide thickness of silicon dioxide of not more than 2 nm, and the results shown in FIG. 9 verify the usefulness of the present invention.

When the $SiO_2$ oxide film thickness is not more than 2 nm, it is desirable that the local variation of the oxide film thickness is in the range of $\Delta_{RSR} \leq 0.15$ nm. This condition is shown with a dotted line in FIG. 8. As shown in FIG. 8, the field effect transistor manufactured by Example 1 satisfies the condition of $\Delta_{RSR} \leq 0.15$ nm.

Incidentally, the leakage current of a MOS field effect transistor based on Example 1 was lowered by about 30% as compared with a MOS field effect transistor manufactured by the conventional method. Thus it was found that the field effect transistor based on Example 1 is excellent also as to the leakage current characteristic.

In Example 1, field effect transistors were experimentally manufactured with the thickness of the $SiO_2$ oxide film as a parameter. As a result, a remarkable improvement in mobility was observed when the $SiO_2$ oxide film thickness was not more than 2 nm.

Figure 10:
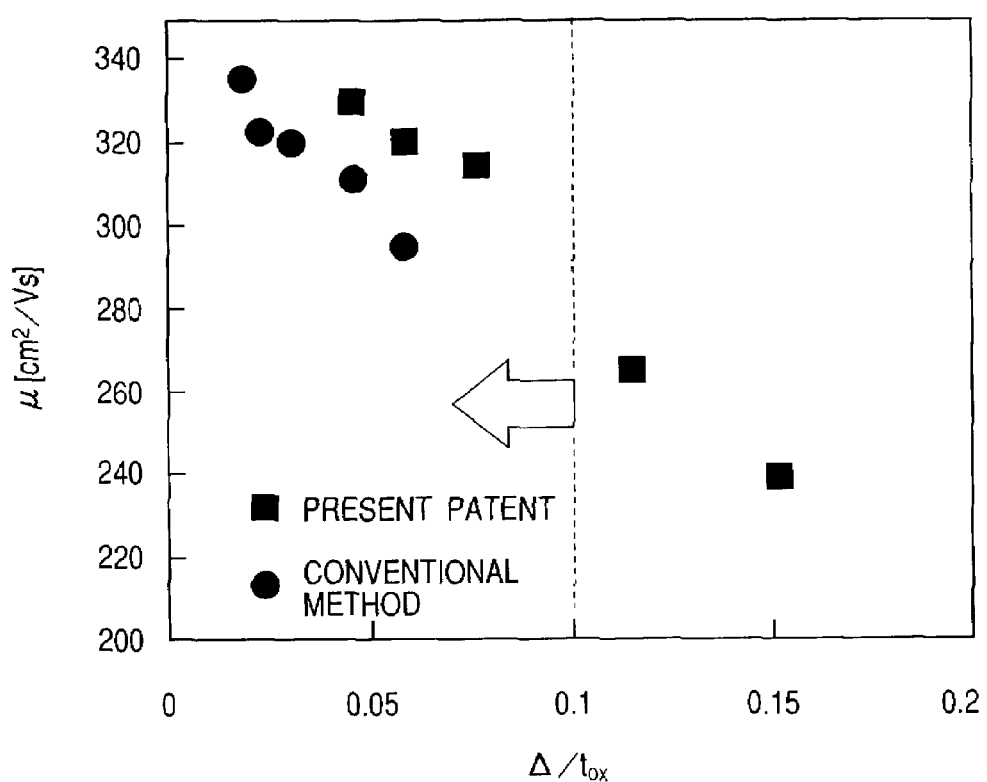
FIG. 10 is a diagram showing the relationship between local variations in oxide film thickness and mobility in First Example.

Incidentally, the amplitude $\Delta_{RSR}$ of the gate roughness can be approximated as the difference $\Delta$ between the maximum and the minimum of the physical thickness of the gate dielectric film present at a channel portion of the field effect transistor. The relationship between the mobility ($\mu_{eff}$) and the roughness obtained in Example 1 is shown as a function of $\Delta/t_{ox}$ in FIG. 10. The symbols ■ represent the characteristic based on the present patent, while the symbols ● represent the results obtained by the conventional method. As a result, it is seen that degradation of the mobility can be alleviated when the local variation of oxide film thickness is within 10% of the average physical thickness. This condition is shown with a dotted line in FIG. 10. The gate dielectric film obtained in Example 1 satisfied the condition at all values of thickness, whereby high mobility could be achieved. Accordingly, when the SiO2 oxide film thickness is not more than 2 nm, it is desirable that the local variation of the oxide film thickness is in the range of $\Delta/t_{ox} < 0.10$.

EXAMPLE 2

Figure 11:
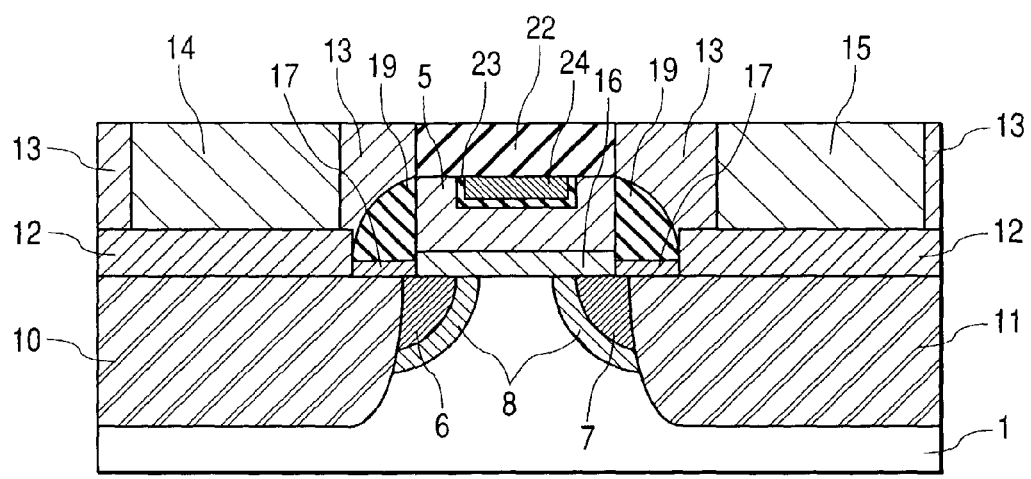
FIG. 11 is a sectional view of a high dielectric metal-insulator-semiconductor field effect transistor (MISFET) according to Second Example.

FIG. 11 is a sectional view of a field effect transistor (FET) according to Example 2 of the present invention, and FIGS. 12 to 16 are sectional views of the device in the sequence of the manufacturing steps thereof.

The field effect transistor according to Example 2 is mainly characterized by comprising a high dielectric gate dielectric film 16. Here, the high dielectric gate dielectric film 16 means a gate dielectric film having a relative dielectric constant higher than that of a $SiO_2$ gate dielectric film 2. Concrete examples of the high dielectric gate dielectric film include $Al_2O_3$, $HfO_2$, $ZrO_2$, $Ta_2O_5$, $HfSiO_x$, and $ZnSiO_x$.

Figure 12:
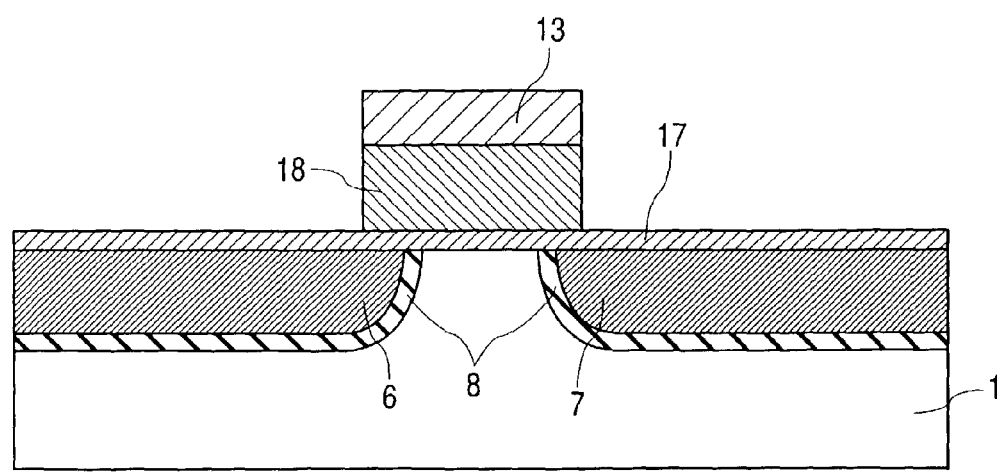
FIG. 12 is a sectional view of a device in the sequence of manufacturing steps of the high dielectric MISFET according to Second Example.

Referring to FIG. 12, a semiconductor substrate 1 composed of single-crystalline Si is subjected to formation of a device insulation dielectric region (not shown) for defining an active region, injection of p-conduction type ions for control of substrate concentration and extending thermal treatment, ion injection for control of threshold voltage and an activation annealing process by a conventional method, as in the case of an ordinary semiconductor device. The semiconductor substrate 1 was p-conduction type silicon having a plane orientation of (100) and a diameter of 20 cm.

A thermal oxide film 17 was formed in a thickness of 5 nm on the semiconductor substrate prepared as above. Next, an amorphous non-doped Si film 18 was built up in a thickness of 150 nm on the thermal oxide film 17, and then a silicon oxide film was built up in a thickness of 50 nm to form a surface passivation dielectric film 13. Thereafter, a dummy gate electrode 18 shaped as shown in FIG. 12 was formed by ordinary lithography and etching (FIG. 12).

After the formation of the dummy gate electrode 18, P-ions were injected in a vertical direction to form a shallow source diffusion layer 6 and a shallow drain diffusion layer 7, with an impurity concentration of about $1 \times 10^{20}/cm^3$. Subsequently, thermal treatment was carried out at 1050° C. for 1 second to activate the injected impurity. Then, B-ions were injected so as to wrap the shallow source diffusion layer 6 and the shallow drain diffusion layer 7. This p-conduction type region is made to be a p-conduction type punch through stopper diffusion layer 8 for functioning as a punch through stopper (FIG. 12).

Figure 13:
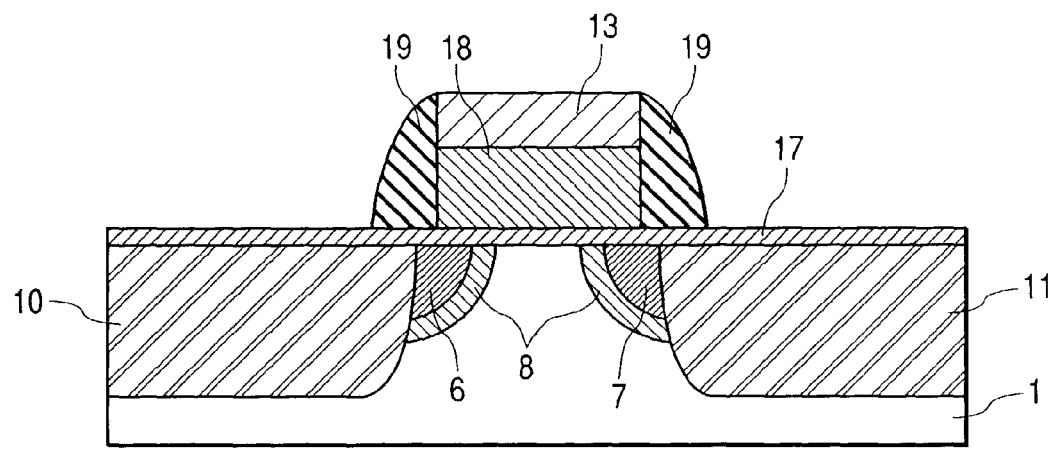
FIG. 13 is a sectional view of the device in the sequence of manufacturing steps of the high dielectric MISFET according to Second Example.

$Si_3N_4$ was built up on the semiconductor substrate prepared as above, and was then selectively left only at side wall portions of the dummy gate electrode 18 by anisotropic dry etching to form dummy gate side wall dielectric films 19. With the dummy gate side wall dielectric films 19 as an ion injection inhibitive mask, an n-type high concentration drain diffusion layer 11 and an n-type high concentration source diffusion layer 12 with an impurity concentration of about $1 \times 10^{20}/cm^3$ were formed, and then an activation annealing process for injected ions was carried out at 1050° C. for 1 second (FIG. 13).

Figure 14:
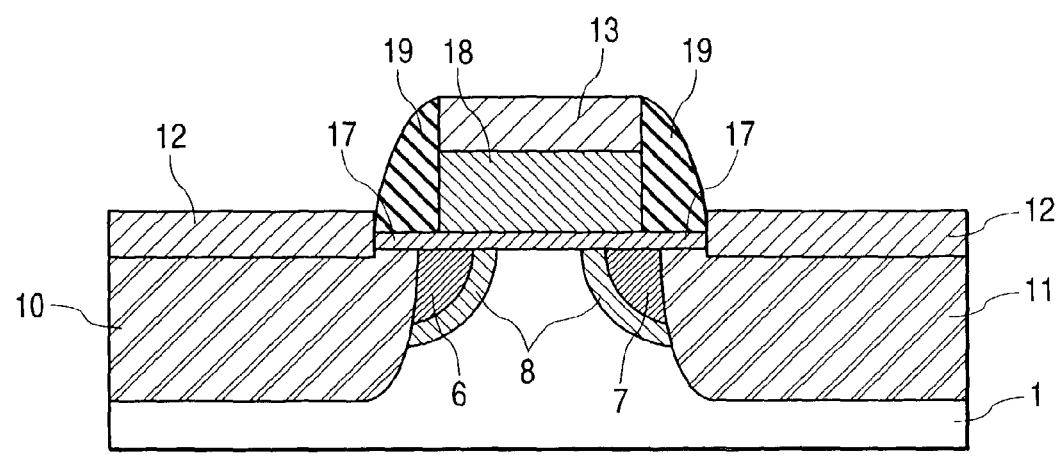
FIG. 14 is a sectional view of the device in the sequence of manufacturing steps of the high dielectric MISFET according to Second Example.

Subsequently, exposed portions of the $SiO_2$ dielectric film 17 are removed by use of diluted hydrofluoric acid, and then a cobalt (Co) film is built up in a small thickness on the entire surface by sputtering. The stack was subjected to short period annealing at 500° C. to silicidize the Co film. The unreacted Co film is removed by a mixture of hydrochloric acid and oxygenated water, selectively leaving the Co silicide film 12 on the exposed areas of the Si substrate. Then, short period thermal treatment was carried out to lower the resistance of the Co silicide film 12 (FIG. 14).

By this step, in this Example 2, the number of thermal treatments after the formation of a gate dielectric film 16 can be decreased, as compared with the step of forming the Co silicide film 9 after the formation of the gate dielectric film 2 as in Example 1. As a result, the thickness variation of the gate dielectric film 16 is reduced, and a field effect transistor with high mobility can be produced.

Figure 15:
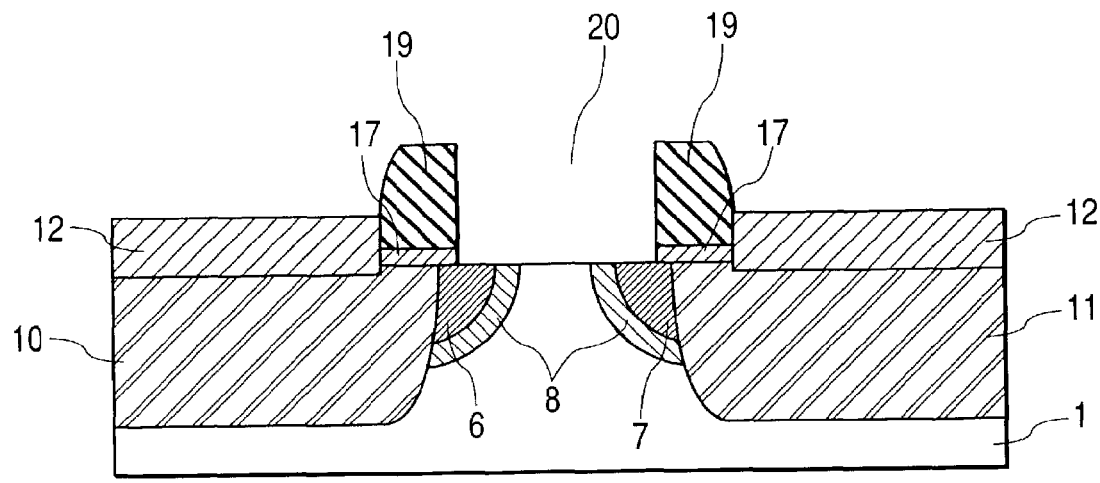
FIG. 15 is a sectional view of the device in the sequence of manufacturing steps of the high dielectric MISFET according to Second Example.

A thick silicon oxide film is built up on the semiconductor substrate prepared as above, and the surface thereof is planarized by chemical mechanical polishing (CMP) to form a surface passivation dielectric film. Then, annealing was carried out in a nitrogen ambient at 800° C. for 30 minutes. Next, the entire surface was planarized by chemical mechanical polishing (CMP) to expose the upper surface of the dummy gate electrode 18. Thereafter, the dummy gate electrode 18 is selectively removed. Further, thereafter, the exposed portion of the $SiO_2$ dielectric film 17 was removed by use of diluted hydrofluoric acid to form an opening portion 20 (FIG. 15). The opening portion 20 reaches a part of the semiconductor substrate.

By forming the Co suicide film 12 on the source 6, 10 and the drain 7, 11 prior to the formation of the gate dielectric film 16 as in this Example 2, thermal load exerted on the gate dielectric film 2 and a metal gate electrode 21 can be alleviated. Therefore, a high dielectric constant gate dielectric film 16 (i.e., a gate dielectric film having a high dielectric constant) with high quality can be obtained, and, as a result, high mobility can be achieved.

Figure 16:
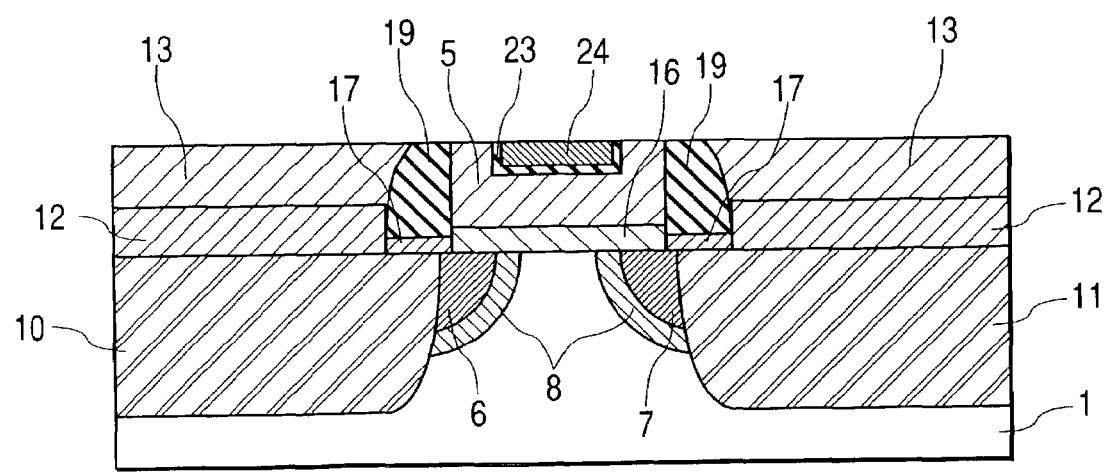
FIG. 16 is a sectional view of the device in the sequence of manufacturing steps of the high dielectric MISFET according to Second Example.

Thereafter, the high dielectric gate dielectric film 16 was built up at the opening portion 20 by chemical vapor deposition. As the high dielectric gate dielectric film 16, three materials of $Al_2O_3$, $ZrO_2$ and $HfO_2$ were used, and differences among the device characteristics were examined. The film formation was carried out under conditions in which the high dielectric gate dielectric film 16 is built up in an amorphous state. As for the average $t_{ox}$ of the physical thickness of the high dielectric gate dielectric film 16, the build-up time was so controlled that the equivalent oxide thickness of silicon dioxide $t_{EOT}(t_{EOT}=t_{ox}\cdot \in_{SiO2}/\in_{ox})$ after thermal treatment would be 1.5 nm. Four kinds of thermal treatment were carried out, with the thermal treatment temperature before the formation of the gate electrode as a parameter, at 700° C., 800° C., 900° C., and 1000° C. Subsequently, an in situ phosphorus-doped poly-crystalline Si film 5 becoming a gate electrode 5 was built up in the opening portion 20 in a thickness of 100 nm at a temperature of 630° C. by use of monosilane ($SiH_4$) and phosphine ($PH_3$). Then, tungsten nitride ($WN_x$) was built up in a thickness of 5 nm by reactive sputtering to form a $WN_x$ barrier layer 23. Thereafter, tungsten (W) was built up in a thickness of 50 nm by sputtering to form a tungsten gate electrode 24. Thereafter, an ordinary activation annealing process at a low temperature was carried out, and the entire surface was planarized by chemical mechanical polishing (CMP) to produce a replacement gate process transistor (FIG. 16).

Thereafter, a thick silicon oxide built-up film was formed on the entire surface, the surface passivation dielectric film 13 was provided with an opening in a desired region, a TiN film as a diffusion barrier metal for an interconnection metal and a W film as the interconnection metal were built up, and planarizing polishing was carried out to selectively leave the W film only at the opening portion. Finally, building-up of a metallic film consisting mainly of aluminum and patterning thereof were carried out according to a desired circuit constitution to form a drain electrode 15, a source electrode 14 and interconnections inclusive of a gate electrode interconnection 22, thereby producing a field effect transistor. A sectional view of the device in this condition is FIG. 11.

Figure 17:
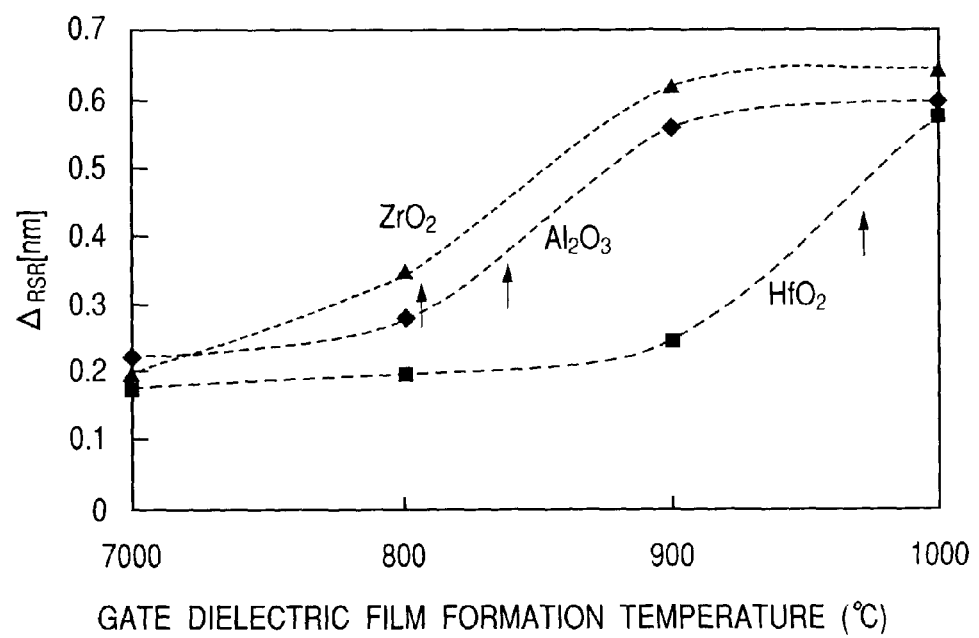
FIG. 17 is a diagram showing the relationship between gate dielectric film thickness and roughness in the high dielectric MISFET according to Second Example.

The interface of the gate dielectric film in the field effect transistor obtained in Example 2 was observed under a transmission electron microscope (TEM). An example of the results is shown in FIG. 17. FIG. 17 shows the relationship between gate dielectric film formation temperature and thickness roughness amplitude $\Delta_{RSR}$. As shown in FIG. 17, it was ascertained that the magnitude of the thickness roughness amplitude $\Delta_{RSR}$ varies depending on the material of the high dielectric gate dielectric film 16 and on the thermal treatment temperature. In FIG. 17, the crystallization temperatures different for the different materials are indicated by arrows. It is seen that the thickness roughness amplitude $\Delta_{RSR}$ increases when the temperature of the activation annealing process of the gate electrode 5 exceeds the crystallization temperature of the high dielectric gate dielectric film 16.

Figure 18:
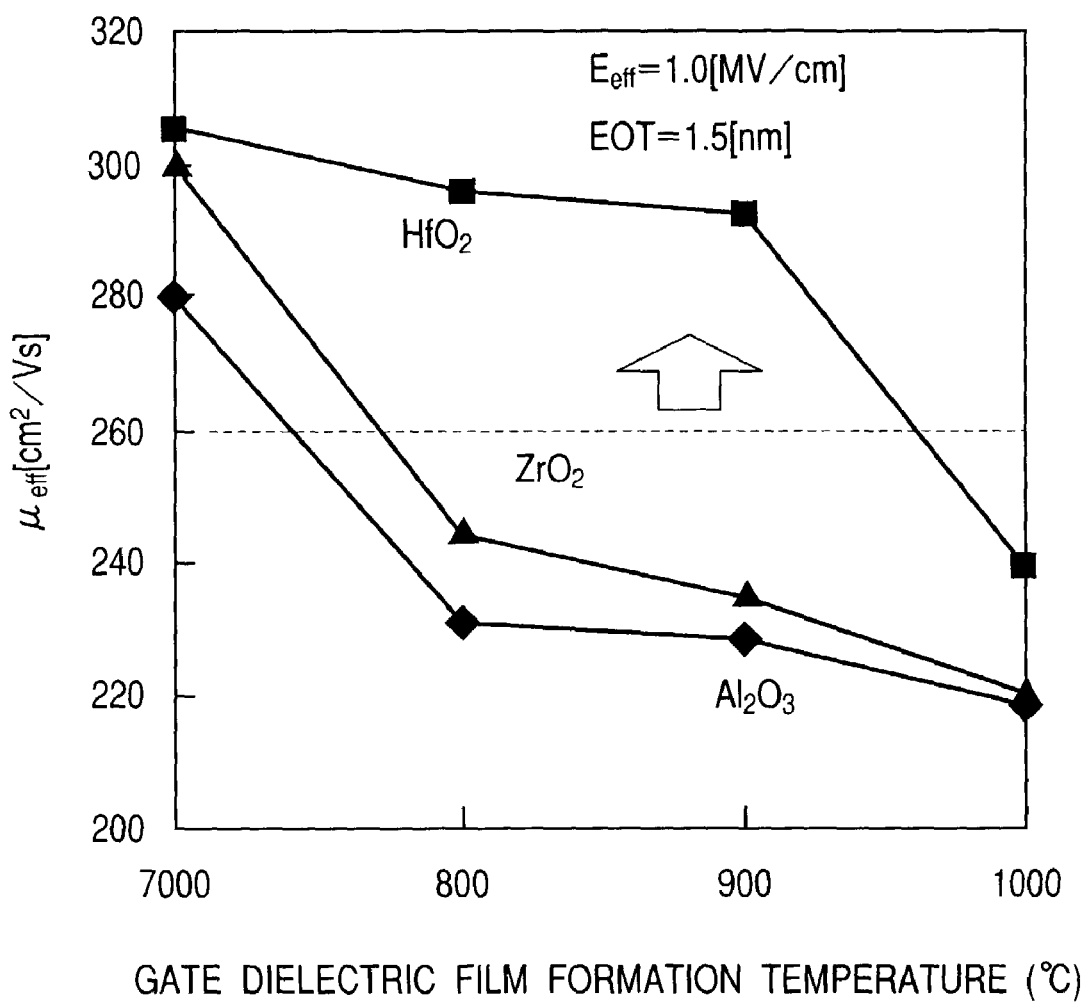
FIG. 18 is a diagram showing the dependence of mobility on thermal treatment temperature in Second Example.

In the high dielectric metal-insulator-semiconductor field effect transistor (MISFET) obtained in Example 2, dependency of mobility on thermal treatment temperature was observed as exemplified in FIG. 18. The axis of abscissas is the gate dielectric film formation temperature, and the axis of ordinates is the mobility $\mu_{eff}$. The dependency of the mobility on the material of the high dielectric gate dielectric film 16 and on the thermal treatment temperature corresponds to the dependency of the thickness roughness amplitude $\Delta_{RSR}$ on the gate dielectric film formation temperature shown in FIG. 17.

The same condition as ascertained in Example 1, namely, the condition where the local variation of oxide thickness is in the range of $\Delta/t_{ox}<0.10$, where $\Delta$ is the difference between the maximum and the minimum of physical thickness of the gate dielectric film, is indicated by a dotted line in FIG. 18. This shows that the degradation in mobility can be suppressed to be low in the case where the high dielectric gate dielectric film 16 maintains an amorphous state, or crystallization has not much progressed and crystal grains are sparsely present within the film. Therefore, also in the case of using the high dielectric gate dielectric film 16 as the gate dielectric film, it is desirable to manufacture the device so that the local variation of oxide thickness satisfies the condition of $\Delta/t_{ox}<0.10$. Alternatively, in an expression using the thickness roughness amplitude $\Delta_{RSR}$, it is desirable to manufacture the device so that the thickness variation of the dielectric film satisfies the condition of $\Delta_{RSR}<0.15\cdot\epsilon_{ox}/\epsilon_{SiO2}$ nm.

Furthermore, according to the examinations by the present inventors, from the differences among the dielectric constants of the materials of the high dielectric gate dielectric film 16, it turned out that the degradation in mobility is lowered as the dielectric constant increases. For this reason, it has been made clear that the degradation in mobility can be lowered by using the high dielectric gate dielectric film 16 in place of the thermal oxide film 2. This is because, under the condition that the equivalent oxide thickness of $SiO_2$ is constant, the physical thickness can be enlarged in the case of using the high dielectric gate dielectric film 16 as compared with the case of using the thermal oxide film 2, and, therefore, it is easier to satisfy the condition ascertained in Example 1 and this Example 2, and it is possible to suppress the effect of the thickness variation on the degradation in mobility. Accordingly, in the case of using the high dielectric gate dielectric film 16, the degradation in mobility can be alleviated by gentle control of thickness variation as compared with the case of using the thermal oxide film 2.

EXAMPLE 3

Figure 19:
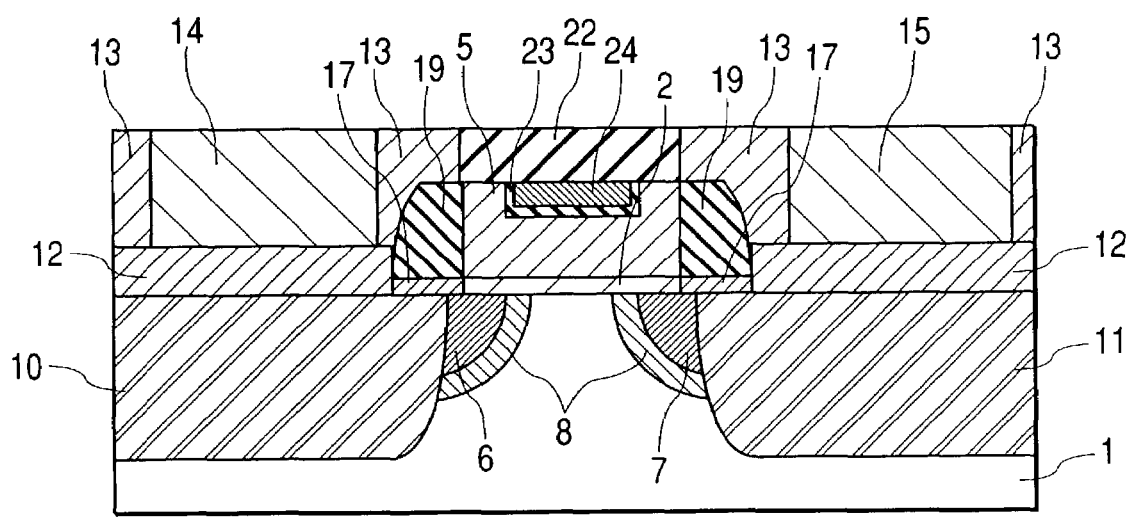
FIG. 19 is a sectional view of a field effect transistor (FET) according to Third Example.

FIG. 19 is a sectional view of a field effect transistor (FET) according to Example 3 of the present invention. Here, a description will be made of an example of a field effect transistor in which high mobility is achieved by carrying out an activation annealing process for the substrate prior to the formation of a gate dielectric film.

First, a structure in which a Co silicide film 12 is formed on a source 6, 10 and a drain 7, 11 and a channel portion is opened as shown in FIG. 15 by the same steps as in Example 2 is prepared.

Referring to FIG. 19, subsequently, a thermal oxide film 2 is formed in the opening portion 20. With the thickness of the thermal oxide film 2 as a parameter, five kinds of thermal oxide films with thicknesses of 1.5 nm, 2 nm, 3 nm, and 4 nm, respectively, were formed.

Next, an in situ phosphorus-doped poly-crystalline Si film 5 becoming a gate electrode 5 was built up in a thickness of 100 nm at the opening portion 20 at a temperature of 630° C. by use of monosilane ($SiH_4$) and phosphine ($PH_3$). Subsequently, tungsten nitride ($WN_x$) was built up in a thickness of 5 nm by reactive sputtering to form a $WN_x$ barrier layer 23, and tungsten W was built up in a thickness of 50 nm by sputtering to form a W gate electrode 24. Subsequently, low temperature activation annealing was carried out, and the entire surface was planarized by chemical mechanical polishing (CMP) to produce a replacement gate process transistor.

Thereafter, a thick silicon oxide built-up film was formed on the entire surface, a surface passivation dielectric film 13 is provided with an opening in a desired region, then a TiN film as a diffusion barrier metal for an interconnection metal and a W film as the interconnection metal were built up, and planarizing polishing was conducted to selectively leave the W film only at the opening portion. Finally, build-up of a metallic film consisting mainly of aluminum and patterning thereof were conducted to form a drain electrode 15, a source electrode 14, and interconnections inclusive of a gate electrode interconnection 22 according to a desired circuit constitution, thereby producing a field effect transistor. FIG. 19 shows this condition.

The interface of the gate dielectric film in the field effect transistor obtained in Example 3 was observed in detail under a transmission electron microscope (TEM). As contrasted to the field effect transistor manufactured by the conventional method in which the thickness roughness amplitude $\Delta_{RSR}$ was about 0.23 nm and the correlation length $L_{RSR}$ was about 2.2 nm as described in Example 1, the field effect transistor of FIG. 19 based on this Example 3 had a $\Delta_{RSR}$ of about 0.15 nm and a $\Lambda_{RSR}$ of about 1.7 nm; it was ascertained that the local variation in the oxide film thickness had been suppressed to be low. This is because the activation annealing process for the substrate was carried out before the formation of the gate dielectric film, whereby the thermal treatment after the formation of the gate dielectric film could be mitigated, so that the problem of the increase in the gate roughness attendant on the poly-crystallization of the gate electrode 5 could be mitigated.

Figure 20:
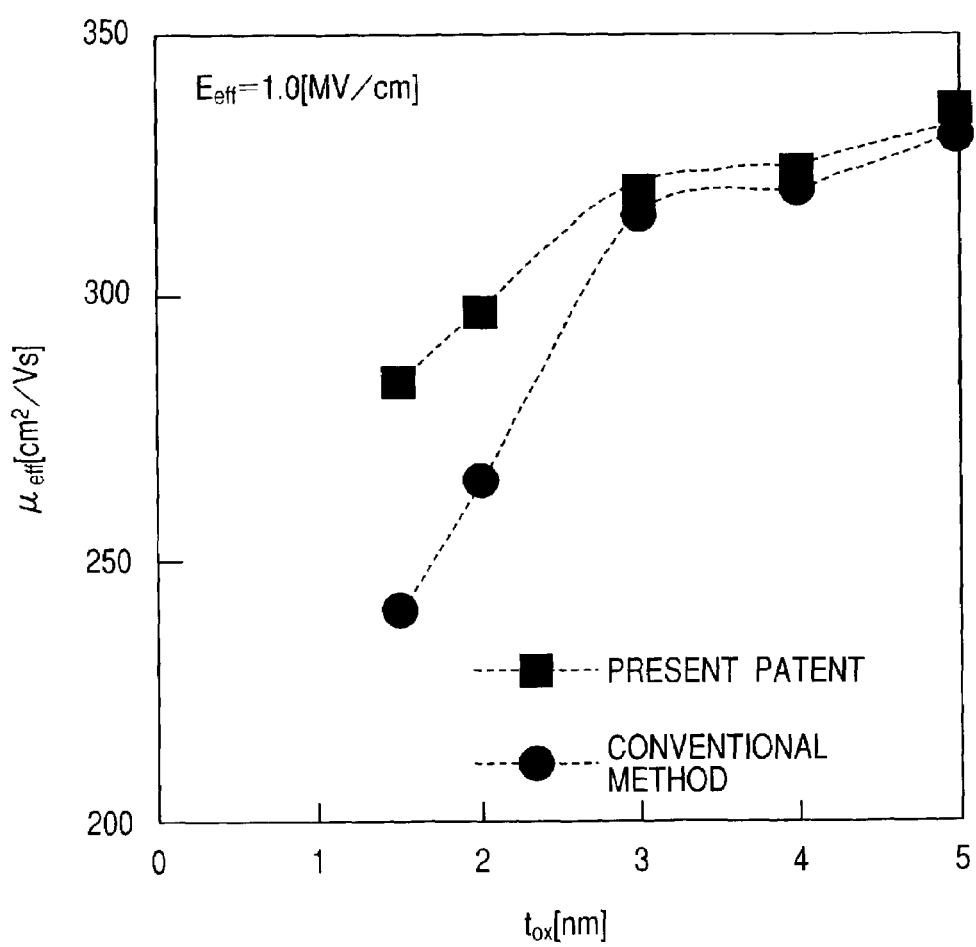
FIG. 20 is a diagram showing the dependence of mobility on dielectric film thickness in Third Example.

As a result, in the field effect transistor based on this Example 3 manufactured by the above-mentioned manufacturing steps, an increase in mobility was observed as compared with the field effect transistor manufactured by the conventional method. As exemplified in FIG. 20, an increase of not less than 10% at maximum in mobility was observed. In FIG. 20, the symbols ■ represent the characteristic according to the present patent, while the symbols ● represent the results obtained by the conventional method. Accordingly, it was made clear that when a field effect transistor is manufactured by use of the dummy gate structure, the uniformity of thickness of the gate dielectric film is enhanced and, therefore, a high mobility can be achieved. Conventionally, it has been considered that the dummy gate structure is effective in the case of using a high dielectric gate dielectric film 16 weak to high temperature treatments. However, it has been, discovered that, according to the present invention, even in the case of using the thermal oxide film 2 as the gate dielectric film, the thermal treatment temperature can be lowered, so that crystal grain growth of the gate electrode can be suppressed, and a gate dielectric film with extremely excellent uniformity can be produced. Therefore, also in the case of using $SiO_2$ or a silicon oxynitride film, manufacturing the field effect transistor through a low temperature thermal treatment using the dummy gate structure is effective in achieving a high mobility.

It has also been made clear that, in the field effect transistor based on this Example 3, since the capacitance-voltage characteristic does not undergo a lowering of capacitance attendant on depletion of the gate electrode, the equivalent oxide thickness of $SiO_2$ is lowered by about 0.4 nm as compared with the field effect transistor using poly-crystalline Si according to the prior art. Accordingly, it has been revealed that the field effect transistor based on this Example 3 is excellent, also from the viewpoint of capacitance characteristic.

EXAMPLE 4

Figure 21:
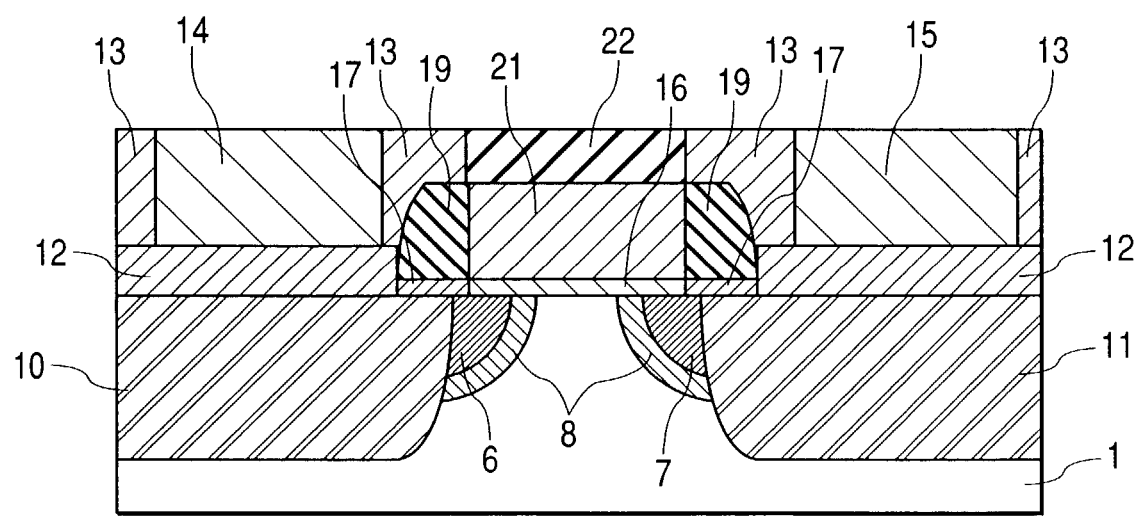
FIG. 21 is a sectional view of a field effect transistor (FET) according to Fourth Example.

FIG. 21 is a completed sectional view of a field effect transistor (FET) according to Example 4 of the present invention. Here, a description is made of Example 4 in which a metal is used for a gate electrode directly above a gate dielectric film, and, further, a high dielectric material (i.e., a material having a high dielectric constant) is used for the gate dielectric film, whereby a gate dielectric film with high quality is formed and a high mobility is achieved.

First, a structure in which a Co silicide film 12 is formed on a source 6, 10 and a drain 7, 11 and a channel portion is opened, as shown in FIG. 15, is manufactured by the same steps as in Example 2.

Thereafter, a high dielectric gate dielectric film 16 was built up in the opening portion 20 by chemical vapor deposition (CVD). For the high dielectric gate dielectric film 16, $Al_2O_3$ was used. While $Al_2O_3$ was used for the high dielectric gate dielectric film 16 in this example, other material, preferably a material with little crystal grain growth and high dielectric constant is preferably used. As for the average $t_{ox}$ of physical thickness of the high dielectric gate dielectric film 16, build-uptime and thermal treatment temperature were optimized so that the equivalent oxide thickness of $SiO_2$ ($t_{EOT}$) after thermal treatment would be one of four values 1.5 nm, 2 nm, 2.5 nm, and 3 nm. As described above, $t_{EOT}=t_{ox} \cdot \in_{SiO2}/\in_{ox}$.

Subsequently, tantalum nitride (TaN) becoming a metal gate electrode 21 was vapor deposited in a thickness of 150 nm at the opening portion 20 by reactive sputtering in a nitrogen ambient. While TaN was used as the gate dielectric film in this Example 4, other metals, preferably materials which have a high melting point and in which the temperature for crystal grain growth to occur is higher than the maximum temperature in the subsequent interconnection steps may be used.

Subsequently, a thick silicon oxide built-up film was formed on the entire surface, and the entire surface was planarized by chemical mechanical polishing (CMP) to form a replacement gate process transistor. Then, a surface passivation dielectric film 13 was provided with an opening in a desired region, thereafter a TiN film as a diffusion barrier metal for an interconnection metal and a tungsten (W) film as the interconnection metal were built up, and planarizing polishing thereof was conducted to selectively leave the W film only at the opening portion. Finally, build-up of a metallic film consisting mainly of aluminum and patterning thereof were carried out to form a drain electrode 15, a source electrode 14, and interconnections inclusive of a gate electrode interconnection 22 according to a desired circuit constitution, thereby manufacturing a field effect transistor (FIG. 21).

The interface of the gate dielectric film in the field effect transistor based on this Example 4 manufactured through the above steps was observed in detail under a transmission electron microscope (TEM). As a result, the following facts were revealed. As compared with the field effect transistor manufactured by the conventional method which had a thickness roughness amplitude ($\Delta_{RSR}$) of about 0.23 nm and a correlation length ($\Lambda_{RSR}$) of about 2.2 nm as described in Example 1, the field effect transistor based on this Example 4 (the structure is shown in FIG. 21) had a $\Delta_{RSR}$ of about 0.17 nm and a $\Lambda_{RSR}$ of about 1.8 nm. Thus, it was ascertained that in the present invention the local variation in the oxide film thickness is suppressed to be low. This is because the problem of the increase in gate roughness due to the polycrystallization of the gate electrode 5 could be obviated by using the metal gate electrode 21 in place of poly-crystalline Si as the gate electrode 5. In addition, a gate roughness on the same order as that shown in Example 3 above was obtained; this reveals that the mitigation of the gate roughness by use of the metal gate electrode 21 can be expected in the same manner even when the $SiO_2$ gate dielectric film 2 as the gate dielectric film is replaced with the high dielectric gate dielectric film 16.

Figure 22:
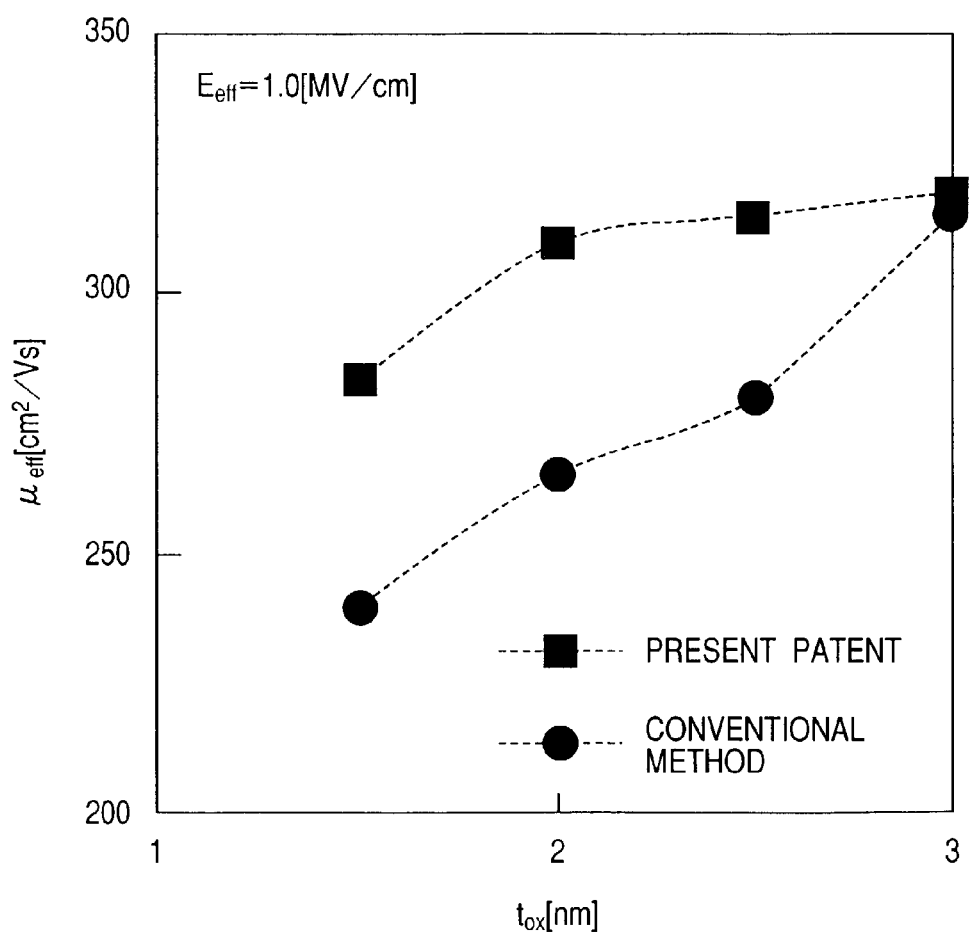
FIG. 22 is a diagram showing the dependence of mobility on equivalent oxide thickness of silicon dioxide in Fourth Example.

As a result, for example, the value of the mobility ($\mu_{eff}$) at the time when an electric field of 1 MV/cm is impressed on the inversion layer in a direction perpendicular to the interface was enhanced by not less than 15% at maximum, in the field effect transistor based on this Example 4 manufactured through the above-mentioned steps, as compared with the field effect transistor manufactured by the conventional method. FIG. 22 is a diagram showing an example of the relationship between the average $t_{ox}$ of physical thickness of the gate dielectric film 16 and the mobility. The symbols ■ represent the characteristic based on the present patent, and the symbols ● represent the results obtained by the conventional method.

Thus, it was made clear that when a field effect transistor is manufactured by use of a metal gate electrode 21 and a high dielectric gate dielectric film 16, the uniformity of thickness of the gate dielectric film is enhanced and, therefore, a high mobility is achieved.

It was also made clear that, in the field effect transistor based on this Example 4, the capacitance-voltage characteristic does not undergo a lowering of capacitance attendant on the depletion of the gate electrode, so that the equivalent oxide thickness of $SiO_2$ is lowered by about 0.4 nm as compared with the field effect transistor using a poly-crystalline Si gate electrode 5 according to the prior art. Therefore, the field effect transistor based on this Example 4 was revealed to be excellent, also from the viewpoint of capacitance characteristic.

While some examples have been described above, according to the present invention, a field effect transistor with high mobility can be manufactured through lowering the thickness variation in the field effect transistor having an equivalent oxide thickness of $SiO_2$ of not more than 2 nm. Therefore, an increase in drain current can be achieved in a miniaturized field effect transistor. In particular, the present invention is effective not only in a current increase in NMOS but also in a current increase in PMOS. Accordingly, a current increase in CMOS can be achieved inexpensively by simply adding the step for controlling the thickness variation.

Besides, according to the present invention, it is possible to suppress the degradation in mobility and to achieve a high mobility and, hence, a large current by controlling the thickness variation on an atomic scale, also when a high dielectric gate dielectric film is used.

<Explanation of Symbols>

1: semiconductor substrate; 2: gate dielectric film; 3: amorphous gate electrode; 4: ultrathin $SiO_2$ film; 5: polycrystalline Si gate electrode; 6: shallow source diffusion layer; 7: shallow drain diffusion layer; 8: punch through stopper diffusion layer; 9: gate side wall dielectric film; 10: high concentration source diffusion layer; 11: high concentration drain diffusion layer; 12: silicide film; 13: surface passivation dielectric film; 14: source electrode; 15: drain electrode; 16: high dielectric gate dielectric film; 17: thermal oxide film; 18: dummy gate electrode; 19: dummy gate side wall dielectric film; 20: opening portion; 21: metal gate electrode; 22: gate electrode interconnection; 23: barrier layer; 24: gate electrode.

What is claimed is:

1. A metal-insulator-semiconductor field effect transistor (MISFET) comprising a gate dielectric film formed from a high dielectric constant material which has a relative dielectric constant higher than that of a $SiO_2$ gate dielectric film and is in an amorphous state and having an equivalent oxide thickness (EOT) of silicon dioxide ($t_{EOT}$) of 2 nm or less, given by a formula $t_{EOT}=t_{ox} \cdot \in_{SiO2}/\in_{ox}$, where $\in_{SiO2}$ is a relative dielectric constant of silicon dioxide, $\in_{ox}$ is a relative dielectric constant of said gate dielectric film, and $t_{ox}$ is an average of the physical thickness of said gate dielectric film, wherein a ratio ($\Delta/t_{ox}$) of the difference ($\Delta$) between the maximum and the minimum of said physical thickness of said gate dielectric film present on the upper side of a channel portion of said field effect transistor to the average ($t_{ox}$) of said physical thickness is 10% or less.

2. A semiconductor device comprising a plurality of metal-insulator-semiconductor field effect transistors (MISFETS) on a semiconductor substrate, at least one of said metal-insulator-semiconductor field effect transistors (MISFETS) comprising a gate dielectric film formed from a high dielectric constant material which has a relative dielectric constant higher than that of a $SiO_2$ gate dielectric film and is in an amorphous state and having an equivalent oxide thickness (EOT) of silicon dioxide ($t_{EOT}$) of 2 nm or less, given by the formula $t_{EOT}=t_{ox}\cdot\in_{SiO2}/\in_{ox}$, where $\in_{SiO2}$ is a relative dielectric constant of silicon dioxide, $\in_{ox}$ is a relative dielectric constant of said gate dielectric film, and $t_{ox}$ is an average of the physical thickness of said gate dielectric film, wherein a ratio ($\Delta/t_{ox}$) of the difference ($\Delta$) between the maximum and the minimum of said physical thickness of said gate dielectric film present on the upper side of a channel portion of said field effect transistor to the average ($t_{ox}$) of said physical thickness is 10% or less.

3. A metal-insulator-semiconductor field effect transistor (MISFET) comprising a gate dielectric film formed from a high dielectric constant material which has a relative dielectric constant higher than that of a $SiO_2$ gate dielectric film and is in an amorphous state and having an equivalent oxide thickness (EOT) of silicon dioxide ($t_{EOT}$) of 2 nm or less, given by a formula $t_{EOT}=t_{ox}\cdot\in_{SiO2}/\in_{ox}$, where $\in_{SiO2}$ is a relative dielectric constant of silicon dioxide, $\in_{ox}$ is a relative dielectric constant of said gate dielectric film, and $t_{ox}$ is an average of the physical thickness of said gate dielectric film, wherein dispersion ($\Delta_{RSR}$) of said physical thickness of said gate dielectric film present on the upper side of a channel portion of said field effect transistor is $0.15\cdot\in_{ox}/\in_{SiO2}$ nm or less.

4. A semiconductor device comprising a plurality of metal-insulator-semiconductor field effect transistors (MISFETS) on a semiconductor substrate, at least one of said metal-insulator-semiconductor field effect transistors (MISFETS) comprising a gate dielectric film formed from a high dielectric constant material which has a relative dielectric constant higher than that of a $SiO_2$ gate dielectric film and is in an amorphous state and having an equivalent oxide thickness (EOT) of silicon dioxide ($t_{EOT}$) of 2 nm or less, given by the formula $t_{EOT}=t_{ox}\cdot\in_{SiO2}/\in_{ox}$, where $\in_{SiO2}$ is a relative dielectric constant of silicon dioxide, $\in_{ox}$ is a relative dielectric constant of said gate dielectric film, and $t_{ox}$ is an average of the physical thickness of said gate dielectric film, wherein dispersion ($\Delta_{RSR}$) of said physical thickness of said gate dielectric film present on the upper side of a channel portion of said at least one field effect transistor is $0.15\cdot\in_{ox}/\in_{SiO2}$ nm or less.

5. A metal-insulator-semiconductor field effect transistor (MISFET) comprising a gate dielectric film formed from a high dielectric constant material which has a relative dielectric constant higher than that of a $SiO_2$ gate dielectric film and is in an amorphous state, wherein a value of correlation length $\Lambda_{RSR}$ of gate roughness obtained by fitting a correlation function of a physical thickness of said gate dielectric film present at a channel portion of said field effect transistor with a Gaussian distribution by the least squares method is in the range of $\Lambda_{RSR}<1.0$ nm or $\Lambda_{RSR}>2.5$ nm.

6. A semiconductor device comprising a plurality of metal-insulator-semiconductor field effect transistors (MISFETS) on a semiconductor substrate, at least one of said metal-insulator-semiconductor field effect transistors (MISFETS) having a gate dielectric film formed from a high dielectric constant material which has a relative dielectric constant higher than that of a $SiO_2$ gate dielectric film and is in an amorphous state and wherein a value of a correlation length $\Lambda_{RSR}$ of gate roughness obtained by fitting a correlation function of a physical thickness of said gate dielectric film present at a channel portion of said field effect transistor with a Gaussian distribution by the least squares method is in the range of $\Lambda_{RSR}<1.0$ nm or $\Lambda_{RSR}>2.5$ nm.

7. The metal-insulator-semiconductor field effect transistor (MISFET) of claim 1, wherein electron mobility of conduction electrons in said MISFET is of an order of magnitude of hundreds of units of $cm^2/V\cdot s$.

8. The metal-insulator-semiconductor field effect transistor (MISFET) of claim 7, wherein said electron mobility of said conduction electrons in said MISFET is less than about 400 $cm^2/V\cdot s$.

9. The semiconductor device of claim 2, wherein electron mobility of conduction electrons in said at least one of said MISFETs is of an order of magnitude of hundreds of units of $cm^2/V\cdot s$.

10. The semiconductor device of claim 9, wherein electron mobility of conduction electrons in said at least one of said MISFETs is less than about 400 $cm^2/V\cdot s$.

11. The metal-insulator-semiconductor field effect transistor (MISFET) of claim 3, wherein electron mobility of conduction electrons in said MISFET is of an order of magnitude of hundreds of units of $cm^2/V\cdot s$.

12. The metal-insulator-semiconductor field effect transistor (NISFET) of claim 11, wherein said electron mobility of said conduction electrons in said MISFET is less than about 400 $cm^2/V\cdot s$.

13. The semiconductor device of claim 4, wherein electron mobility of conduction electrons in said at least one of said MISFETs is of an order of magnitude of hundreds of units of $cm^2/V\cdot s$.

14. The semiconductor device of claim 13, wherein electron mobility of conduction electrons in said at least one of said MISFETs is less than about 400 $cm^2/V\cdot s$.

15. The metal-insulator-semiconductor field effect transistor (MISFET) of claim 5, wherein electron mobility of conduction electrons in said MISFET is of an order of magnitude of hundreds of units of $cm^2/V\cdot s$.

16. The metal-insulator-semiconductor field effect transistor (MISFET) of claim 15, wherein said electron mobility of said conduction electrons in said MISFET is less than about 400 $cm^2/V\cdot s$.

17. The semiconductor device of claim 6, wherein electron mobility of conduction electrons in said at least one of said MISFETs is of an order of magnitude of hundreds of units of $cm^2/V\cdot s$.

18. The semiconductor device of claim 17, wherein electron mobility of conduction electrons in said at least one of said MISFETs is less than about 400 $cm^2/V\cdot s$.

19. The metal-insulator-semiconductor field effect transistor (MISFET) of claim 1, wherein said MISFET is devoid of a floating gate electrode, and an amorphous Si film having an average physical thickness of 8 nm or less is provided on said gate dielectric film.

20. The semiconductor device of claim 2, wherein said at least one of said MISFETs is devoid of a floating gate electrode, and an amorphous Si film having an average physical thickness of 8 nm or less is provided on said gate dielectric film.

21. The metal-insulator-semiconductor field effect transistor (MISFET) of claim 3, wherein said MISFET is devoid of a floating gate electrode, and an amorphous Si film having an average physical thickness of 8 nm or less is provided on said gate dielectric film.

22. The semiconductor device of claim 4, wherein said at least one of said MISFETs is devoid of a floating gate electrode, and an amorphous Si film having an average physical thickness of 8 nm or less is provided on said gate dielectric film.

23. The metal-insulator-semiconductor field effect transistor (MISFET) of claim 5, wherein said MISFET is devoid of a floating gate electrode, and an amorphous Si film having an average physical thickness of 8 nm or less is provided on said gate dielectric film.

24. The semiconductor device of claim 6, wherein said at least one of said MISFETs is devoid of a floating gate electrode, and an amorphous Si film having an average physical thickness of 8 nm or less is provided on said gate dielectric film.

25. A metal-insulator-semiconductor field effect transistor (MISFET) of claim 1,
wherein said high dielectric constant material is $Al_2O_3$, $HfO_2$, $ZrO_2$, $Ta_2O_5$, $HfSiO_x$, or $ZnSiO_x$.

26. A metal-insulator-semiconductor field effect transistor (MISFET) of claim 2,
wherein said high dielectric constant material is $Al_2O_3$, $HfO_2$, $ZrO_2$, $Ta_2O_5$, $HfSiO_x$, or $ZnSiO_x$.

27. A metal-insulator-semiconductor field effect transistor (MISFET) of claim 3,
wherein said high dielectric constant material is $Al_2O_3$, $HfO_2$, $ZrO_2$, $Ta_2O_5$, $HfSiO_x$, or $ZnSiO_x$.

28. A metal-insulator-semiconductor field effect transistor (MISFET) of claim 4,
wherein said high dielectric constant material is $Al_2O_3$, $HfO_2$, $ZrO_2$, $Ta_2O_5$, $HfSiO_x$, or $ZnSiO_x$.

29. A metal-insulator-semiconductor field effect transistor (MISFET) of claim 5,
wherein said high dielectric constant material is $Al_2O_3$, $HfO_2$, $ZrO_2$, $Ta_2O_5$, $HfSiO_x$, or $ZnSiO_x$.

30. A metal-insulator-semiconductor field effect transistor (MISFET) of claim 6,
wherein said high dielectric constant material is $Al_2O_3$, $HfO_2$, $ZrO_2$, $Ta_2O_5$, $HfSiO_x$, or $ZnSiO_x$.

* * * * *